US012127396B2

(12) United States Patent
Song et al.

(10) Patent No.: US 12,127,396 B2
(45) Date of Patent: Oct. 22, 2024

(54) METHOD OF MANUFACTURING INTEGRATED CIRCUIT DEVICE

(71) Applicant: SAMSUNG ELECTRONICS CO., LTD., Suwon-si (KR)

(72) Inventors: Hyunji Song, Anyang-si (KR); Jaehoon Kim, Seoul (KR); Kwangho Park, Cheonan-si (KR); Yonghoon Son, Suwon-si (KR); Gyeonghee Lee, Hwaseong-si (KR); Seungjae Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 56 days.

(21) Appl. No.: 17/874,512

(22) Filed: Jul. 27, 2022

(65) Prior Publication Data
US 2022/0359530 A1 Nov. 10, 2022

Related U.S. Application Data

(63) Continuation of application No. 16/916,366, filed on Jun. 30, 2020, now Pat. No. 11,437,382.

(30) Foreign Application Priority Data

Nov. 11, 2019 (KR) ........................ 10-2019-0143655

(51) Int. Cl.
H10B 12/00 (2023.01)
(52) U.S. Cl.
CPC ....... *H10B 12/373* (2023.02); *H10B 12/0387* (2023.02)

(58) Field of Classification Search
CPC ............ H01L 29/6681; H01L 29/0653; H01L 29/7851; H01L 21/76224; H01L 21/31144; H01L 21/3085; H01L 21/3086; H01L 21/31111; H01L 21/30604; H01L 29/66795; H01L 21/76229; H01L 29/7855; H01L 29/0607
See application file for complete search history.

(56) References Cited

U.S. PATENT DOCUMENTS

| 6,534,811 B2 | 3/2003 | Skotnicki et al. |
| 7,531,861 B2 | 5/2009 | Chung et al. |

(Continued)

FOREIGN PATENT DOCUMENTS

| KR | 10-1049298 B1 | 7/2011 |
| KR | 10-2019-0060251 A | 6/2019 |

(Continued)

OTHER PUBLICATIONS

Destefanis, V., "High pressure in situ HCl etching of $Si_{1-x}Ge_x$ versus Si for advanced devices", 2008 Semiconductor Science and Technology, 23, 105019.

(Continued)

*Primary Examiner* — Edward Chin
(74) *Attorney, Agent, or Firm* — Muir Patent Law, PLLC

(57) ABSTRACT

An integrated circuit device includes a plurality of semiconductor layers stacked on a substrate to overlap each other in a vertical direction and longitudinally extending along a first horizontal direction. The plurality of semiconductor layers may have different thicknesses in the vertical direction.

17 Claims, 24 Drawing Sheets

(56) References Cited

U.S. PATENT DOCUMENTS

| | | |
|---|---|---|
| 7,682,985 B2 | 3/2010 | Koemtzopoulos et al. |
| 8,039,902 B2 | 10/2011 | Kim et al. |
| 8,293,608 B2 | 10/2012 | Orlowski et al. |
| 9,831,266 B2 | 11/2017 | Kai et al. |
| 9,941,286 B2 | 4/2018 | Kim et al. |
| 10,217,816 B2 | 2/2019 | Bhuwalka et al. |
| 10,468,414 B2 | 11/2019 | Kim et al. |
| 11,289,486 B2 | 3/2022 | Ahn |
| 2002/0153579 A1 | 10/2002 | Yamamoto |
| 2017/0256609 A1* | 9/2017 | Bhuwalka .......... H01L 29/78696 |
| 2018/0102409 A1* | 4/2018 | Xie ................. H01L 21/823481 |
| 2018/0350685 A1 | 12/2018 | Or-Bach et al. |
| 2019/0043960 A1 | 2/2019 | Koval et al. |
| 2019/0067112 A1 | 2/2019 | Liang et al. |
| 2019/0067322 A1 | 2/2019 | Chen et al. |
| 2019/0081155 A1 | 3/2019 | Xie et al. |
| 2019/0096901 A1 | 3/2019 | Dai et al. |
| 2019/0109040 A1 | 4/2019 | Chao et al. |
| 2019/0148286 A1 | 5/2019 | Or-Bach et al. |
| 2019/0148295 A1 | 5/2019 | Lee et al. |
| 2019/0148489 A1* | 5/2019 | Bhuwalka ........... H01L 29/0665 257/365 |
| 2019/0157095 A1 | 5/2019 | Zhou et al. |
| 2019/0157287 A1 | 5/2019 | Huo et al. |
| 2019/0164985 A1 | 5/2019 | Lee et al. |
| 2019/0172838 A1 | 6/2019 | Jo et al. |
| 2019/0252386 A1 | 8/2019 | Lee et al. |
| 2020/0035705 A1* | 1/2020 | Kim .................. H01L 29/78696 |
| 2020/0043941 A1 | 2/2020 | Kim et al. |
| 2020/0302993 A1* | 9/2020 | Tanaka ................ G11C 11/4076 |
| 2021/0013210 A1* | 1/2021 | Lee ........................ H10B 12/30 |

FOREIGN PATENT DOCUMENTS

| | | |
|---|---|---|
| KR | 10-2019-0080688 A | 7/2019 |
| KR | 10-2019-0098007 A | 8/2019 |
| KR | 10-2020-0015177 A | 2/2020 |
| KR | 1020170102701 B1 | 6/2022 |
| KR | 1020190113192 B1 | 7/2022 |

OTHER PUBLICATIONS

Kwak, Byung-Il, et al., "Formation of Stacked SiGe Nano-Bridges", M.Sc. Thesis, North Carolina State University (August 2007).

Iyer, Subramanian S., et al., "Heterojunction Bipolar Transistors Using Si—Ge Alloys," IEEE Transactions on Electron Device, vol. 36, No. 10, (Oct. 1989).

Zhang, Ying, et al., "Reactive ion etching of SiGe Alloys using $CF_2Cl_2$", Journal of Applied Physics, 71, 1936, (1992).

Office Action dated Apr. 25, 2024 for corresponding Application No. KR 10-2019-0143655.

* cited by examiner

METHOD OF MANUFACTURING INTEGRATED CIRCUIT DEVICE

CROSS-REFERENCE TO RELATED APPLICATIONS

This is a continuation application based on application Ser. No. 16/916,366, filed Jun. 30, 2020, the entire contents of which is hereby incorporated by reference.

Korean Patent Application No. 10-2019-0143655, filed on Nov. 11, 2019, in the Korean Intellectual Property Office, and entitled: "Integrated Circuit Device and Method of Manufacturing the Same," is incorporated by reference herein in its entirety.

BACKGROUND

1. Field

Embodiments relate to an integrated circuit device and a method of manufacturing the integrated circuit device.

2. Description of the Related Art

Due to the development of electronic technology, recently, down-scaling of semiconductor devices is proceeding rapidly. To move beyond the degree of integration in two-dimensional semiconductor devices, the development of three-dimensional semiconductor memory devices, in which memory cells are three-dimensionally arranged, has been undertaken.

SUMMARY

Embodiments are directed to an integrated circuit device including a plurality of semiconductor layers stacked on a substrate to overlap each other in a vertical direction and longitudinally extending along a first horizontal direction. The plurality of semiconductor layers may have different thicknesses in the vertical direction.

Embodiments are also directed to a memory cell array including: a plurality of memory cells repeatedly arranged on a substrate in a first horizontal direction and a second horizontal direction, which are perpendicular to each other, and a vertical direction; and a plurality of semiconductor layers included in a plurality of first memory cells among the plurality of memory cells and overlapping each other in the vertical direction. The plurality of semiconductor layers may be disposed to overlap each other in the vertical direction and may include a pair of source/drain regions spaced apart from each other in the first horizontal direction and a channel region between the pair of source/drain regions. The plurality of semiconductor layers may have different thicknesses in the vertical direction.

Embodiments are also directed to an integrated circuit device, including: a plurality of memory cells repeatedly arranged on a substrate in a first horizontal direction and a second horizontal direction, which are perpendicular to each other, and a vertical direction; and a plurality of semiconductor layers respectively included in the plurality of memory cells. The farther the plurality of semiconductor layers are away from the substrate, the greater thicknesses of the plurality of semiconductor layers in the vertical direction may be.

Embodiments are also directed to a method of manufacturing an integrated circuit device, the method including: forming a mold layer in which a plurality of semiconductor layers and a plurality of sacrificial layers are alternately stacked one by one on a substrate, wherein the plurality of semiconductor layers have different thicknesses in a vertical direction; and forming a plurality of first trenches penetrating the plurality of semiconductor layers and the plurality of sacrificial layers, and a plurality of mold patterns longitudinally extending along a first horizontal direction by anisotropically etching the mold layer.

Embodiments are also directed to a method of manufacturing an integrated circuit device, the method including: forming a mold layer in which a plurality of semiconductor layers having different thicknesses and a plurality of sacrificial layers having a constant thickness are alternately stacked one by one on a substrate; forming a mold pattern including a part of each of the plurality of semiconductor layers and the plurality of sacrificial layers by anisotropically etching the mold layer, the mold pattern longitudinally extending along a first horizontal direction; exposing one end of a first part of each of the plurality of semiconductor layers by removing a second part of each of the plurality of semiconductor layers from the mold pattern; and forming a plurality of capacitors in contact with the one end of the first part of each of the plurality of semiconductor layers.

Embodiments are also directed to a method of manufacturing an integrated circuit device, the method including: forming a mold layer in which a plurality of Si layers having greater thickness farther away from a substrate and a plurality of SiGe layers having a constant thickness are alternately stacked one by one on the substrate; forming a mold pattern including parts of the plurality of Si layers and parts of SiGe layers by anisotropically etching the mold layer and longitudinally extending along a first horizontal direction; substituting the plurality of SiGe layers with a plurality of intermediate insulating layers in the mold pattern; forming a plurality of indent regions each having a height in a vertical direction defined by the plurality of intermediate insulating layers by removing a part of each of the plurality of Si layers; and forming a plurality of capacitors in the plurality of indent regions.

BRIEF DESCRIPTION OF THE DRAWINGS

Features will become apparent to those of skill in the art by describing in detail exemplary embodiments with reference to the attached drawings in which:

FIGS. 2A to 2D are diagrams for describing an integrated circuit device according to an example embodiment, wherein FIG. 2A is a plan view of a partial region of the integrated circuit device, FIG. 2B is an enlarged cross-sectional view taken along line A-A' of FIG. 2A, FIG. 2C is an enlarged cross-sectional view taken along line B-B' of FIG. 2A, and FIG. 2D is a partially enlarged perspective view of some components of a portion indicated by "DX" in FIG. 2A;

FIGS. 3A and 3B are diagrams for describing an integrated circuit device according to an example embodiment, wherein FIG. 3A is an enlarged cross-sectional view of a part corresponding to a cross-section taken along line A-A' of FIG. 2A and FIG. 3B is an enlarged cross-sectional view of a part corresponding to a cross-section taken along line B-B' of FIG. 2A;

FIGS. 4A to 10C are diagrams for describing a method of manufacturing an integrated circuit device according to an example embodiment, wherein FIGS. 4A, 5A, 6A, 7A, 8A, 9A, and 10A are plan views illustrating the method of manufacturing the integrated circuit device, FIG. 9B and FIG. 10C are enlarged cross-sectional views along line B-B' of FIGS. 9A and 10A, respectively.

DETAILED DESCRIPTION

Figure 1:
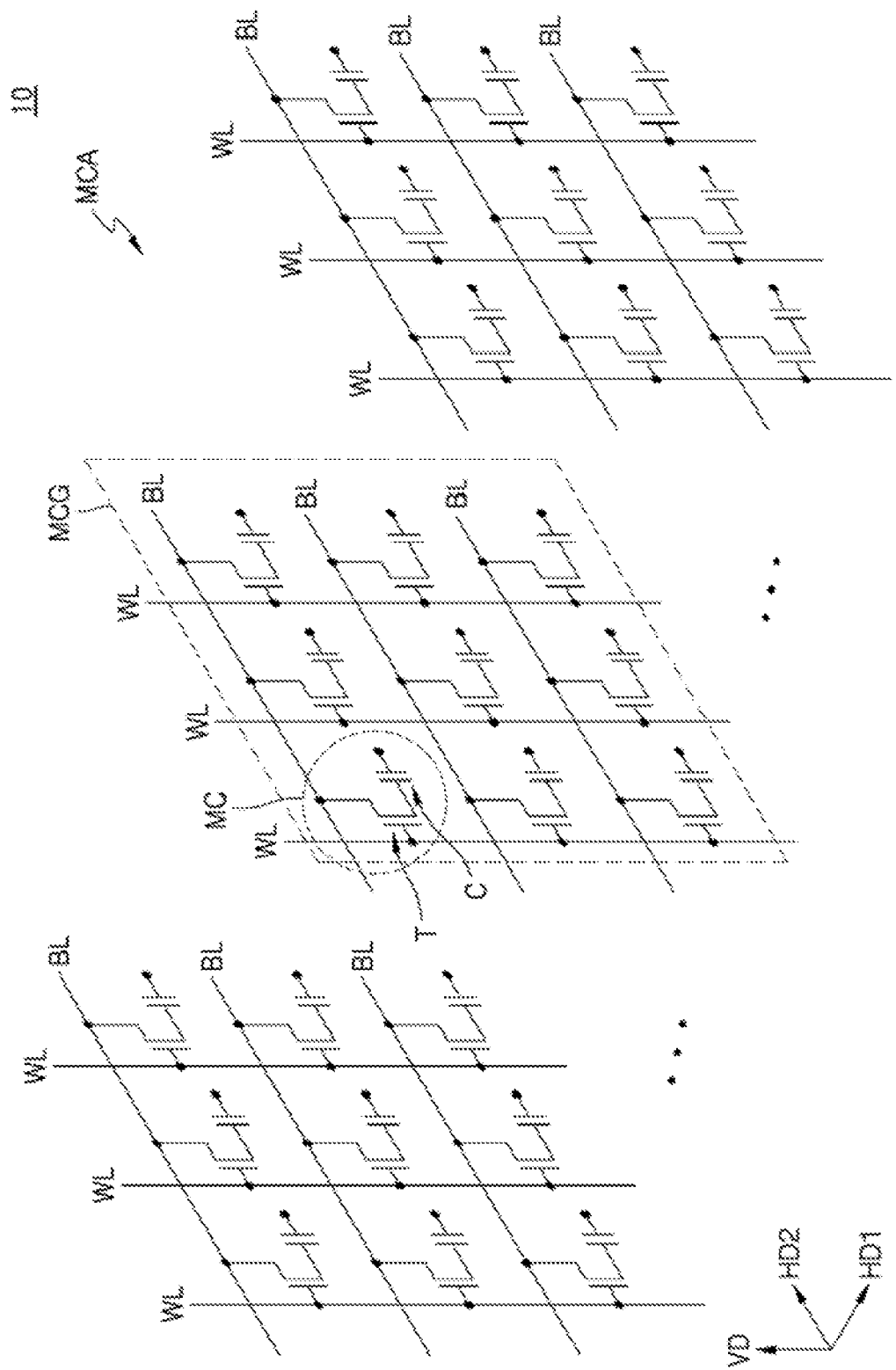
FIG. 1 is a circuit diagram illustrating a circuit configuration of a memory cell array of an integrated circuit device according to an example embodiment.

FIG. 1 is a circuit diagram illustrating a circuit configuration of a memory cell array MCA of an integrated circuit device 10 according to an example embodiment.

Referring to FIG. 1, the integrated circuit device 10 may include the memory cell array MCA. The memory cell array MCA may include a plurality of memory cells MC repeatedly arranged in a first horizontal direction (HD1 direction) and a second horizontal direction (HD2 direction) which are orthogonal to each other and a vertical direction (VD direction).

The memory cell array MCA may include a plurality of memory cell groups MCG including the plurality of memory cells MC arranged in two dimensionally in the second horizontal direction (HD2 direction) and the vertical direction (VD direction). The plurality of memory cell groups MCG may be repeatedly arranged in the first horizontal direction HD1.

The memory cell array MCA may include a plurality of word lines WL and a plurality of bit lines BL that constitute the plurality of memory cells MC. In one memory cell group MCG, the plurality of bit lines BL may extend in parallel to each other in the second horizontal direction (HD2 direction) and may be spaced apart from each other in the vertical direction (VD direction). In one memory cell group MCG, the plurality of word lines WL may extend in parallel to each other in the vertical direction VD, and may be spaced apart from each other in the second horizontal direction (HD2 direction).

A transistor T may be disposed between one word line WL and one bit line BL. A gate of each of the plurality of transistors T constituting the memory cell array MCA may be connected to the word line WL, and a source of each of the plurality of transistors T may be connected to the bit line BL. A drain of each of the plurality of transistors T may be connected to a capacitor C.

In FIG. 1, each of the plurality of memory cells MC includes one transistor T and one capacitor C, but each of the plurality of memory cells MC may include a plurality of transistors.

Figure 2A:
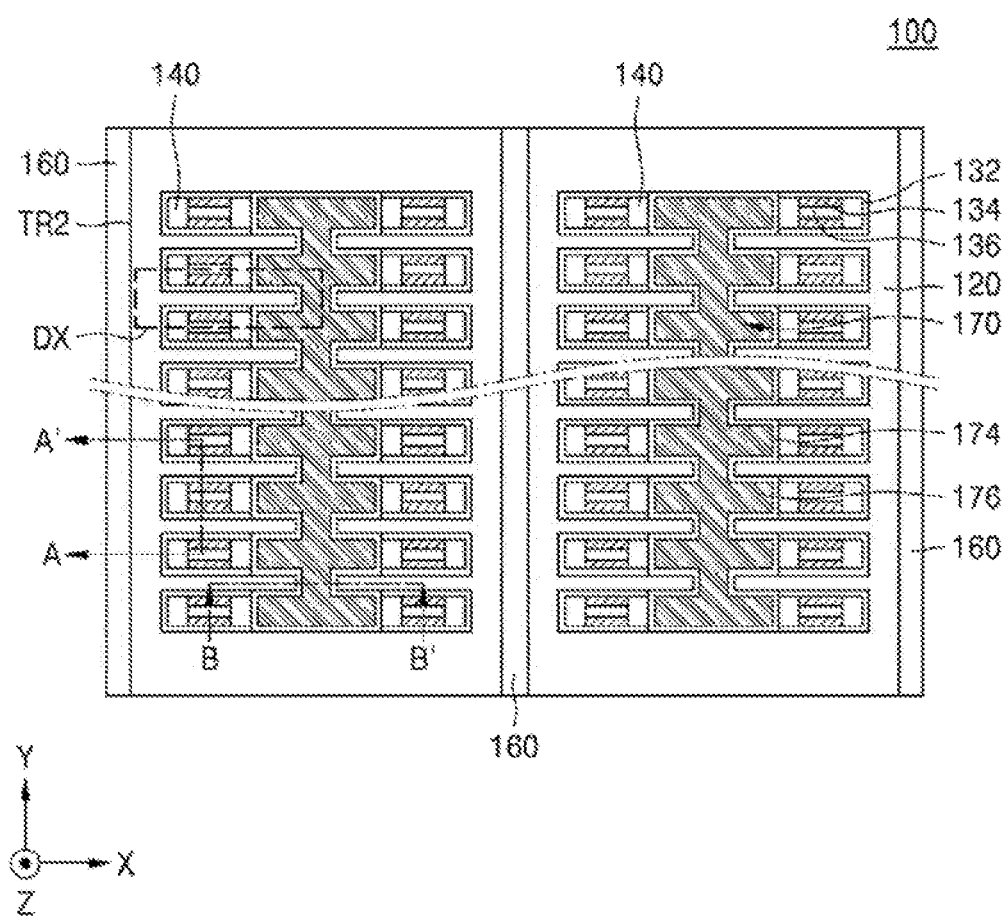
Figure 2B:
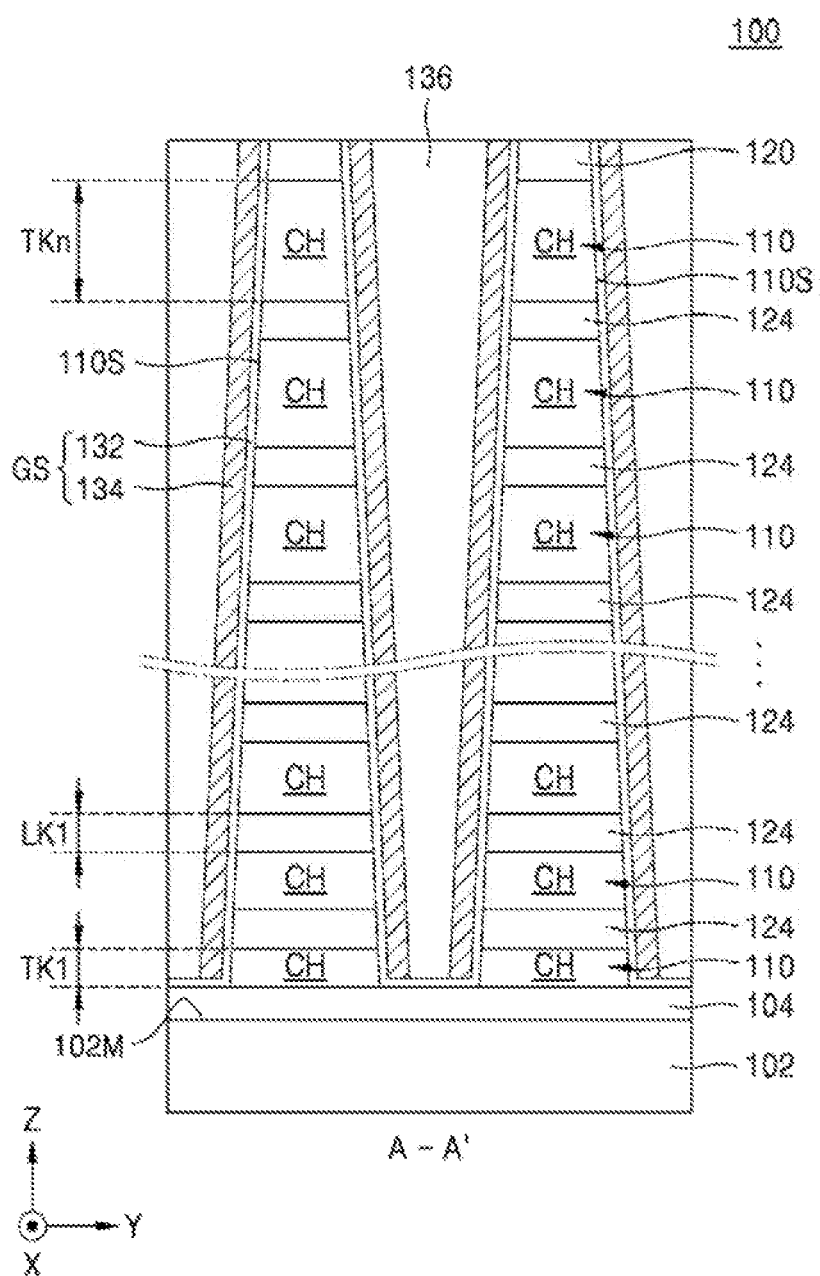
Figure 2C:
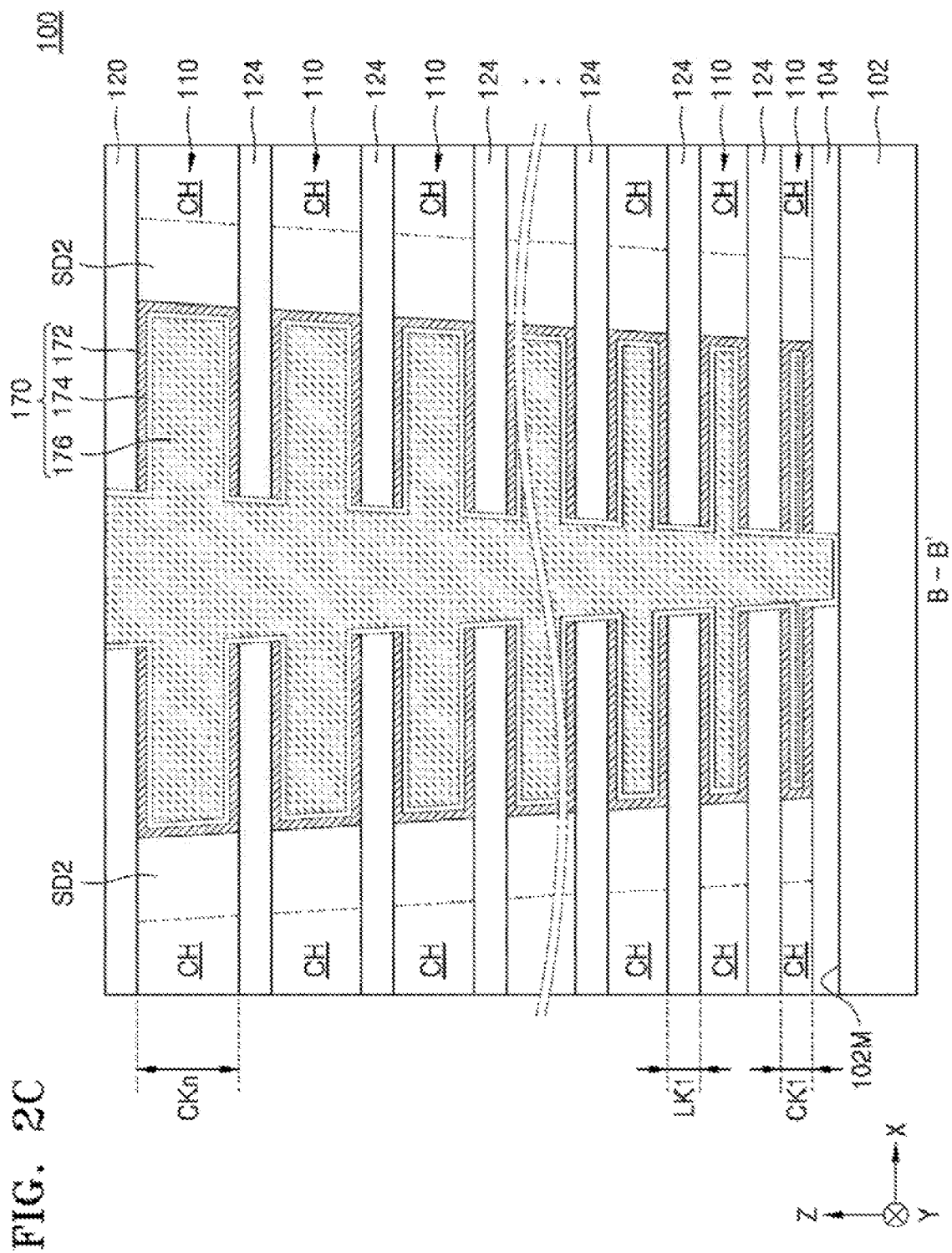
Figure 2D:
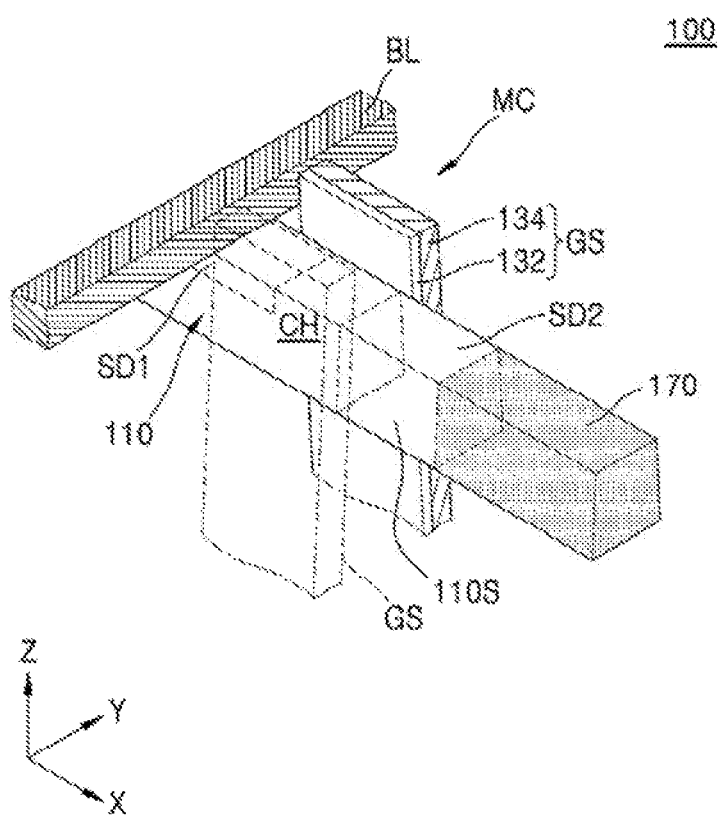

FIGS. 2A to 2D are diagrams for describing an integrated circuit device 100 according to an example embodiment. FIG. 2A is a plan view of a partial region of the integrated circuit device 100. FIG. 2B is an enlarged cross-sectional view taken along the line A-A' of FIG. 2A. FIG. 2C is an enlarged cross-sectional view taken along the line B-B' of FIG. 2A. FIG. 2D is a partially enlarged perspective view of some components of a portion indicated by "DX" in FIG. 2A. The integrated circuit device 100 illustrated in FIGS. 2A to 2D may configure the memory cell array MCA of the integrated circuit device 10 illustrated in FIG. 1.

Referring to FIGS. 2A to 2D, the integrated circuit device 100 may include the plurality of memory cells MC repeatedly arranged in a first horizontal direction (X direction) and a second horizontal direction (Y direction), which are orthogonal to each other, and a vertical direction (Z direction) on a substrate 102. Each of the plurality of memory cells MC may include a plurality of semiconductor layers 110 longitudinally extending in the first horizontal direction (X direction). Each of the plurality of semiconductor layers 110 may include a pair of source/drain regions SD1 and SD2 spaced apart from each other in the first horizontal direction (X direction) and a channel region CH disposed between the pair of source/drain regions SD1 and SD2.

The substrate 102 may include a semiconductor such as Si or Ge, or a compound semiconductor such as SiGe, SiC, GaAs, InAs, InGaAs, or InP. Each of the plurality of semiconductor layers 110 may include, for example, Si, Ge, SiGe, or Indium Gallium Zinc Oxide (IGZO).

Each of the plurality of semiconductor layers 110 may have a thickness selected within a range of, for example, about 5 nm to about 500 nm in the vertical direction (Z direction). For example, each of the plurality of semiconductor layers 110 may have a thickness selected within a range of about 10 nm to about 100 nm. Among the plurality of semiconductor layers 110 included in the integrated circuit device 100, the plurality of semiconductor layers 110 stacked in a line to overlap each other on the substrate 102 in the vertical direction (Z direction) may have different thicknesses in the vertical direction (Z direction). In an example embodiment, the farther the plurality of semiconductor layers 110 are away from the substrate 102, the greater thicknesses of the plurality of semiconductor layers 110 in the vertical direction (Z direction) may be.

As illustrated in FIG. 2B, the plurality of semiconductor layers 110 may have different thicknesses in the vertical direction (Z direction). In an example embodiment, the farther the plurality of semiconductor layers 110 are away from the substrate 102 in the vertical direction (Z direction), the greater the thicknesses of the plurality of semiconductor layers 110 in the vertical direction (Z direction) may be. For example, a first thickness TK1 of the semiconductor layer 110 of the lowest level closest to the substrate 102 among the plurality of semiconductor layers 110 may be the smallest. Among the plurality of semiconductor layers 110, a second thickness TKn of the semiconductor layer 110 of the highest level farthest from the substrate 102 may be the largest. The thickness of each of the other semiconductor layers 110 disposed between the semiconductor layer 110 of the lowest level and the semiconductor layer 110 of the highest level among the plurality of semiconductor layers 110 may be selected within a range greater than the first thickness TK1 and smaller than the second thicknesses TKn, and may gradually increase as each of the other semiconductor layers 110 is disposed farther away from the substrate 102. In an example embodiment, cross-sectional areas (along a plane parallel to the second horizontal direction (Y direction) and the vertical direction (Z direction)) of the plurality of channel regions CH included in the plurality of semiconductor layers 110 stacked in a line to overlap each other on the substrate 102 in the vertical direction (Z direction) may be substantially the same or similar regardless of the distance from the substrate 102.

Each of the plurality of semiconductor layers 110 may have a columnar shape longitudinally extending in the first horizontal direction (X direction). The width of each of the plurality of semiconductor layers 110 in the second horizontal direction (Y direction) may gradually decrease as each of the plurality of semiconductor layers 110 is disposed farther away from the substrate 102. Each of the plurality of semiconductor layers 110 may have a bottom surface and a top surface that extend flat in a direction parallel to a main surface 102M of the substrate 102. In the second horizontal direction (Y direction), the width of the top surface may be smaller than the width of the bottom surface. Both sidewalls 110S of each of the plurality of semiconductor layers 110 in the second horizontal direction Y may be formed as an inclined surface. For example, the sidewalls 110S of each of the plurality of semiconductor layers 110 may be formed as the inclined surface to form an angle greater than 0 with respect to a plane along a normal line of the main surface 102M of the substrate 102 and may have the shape inclined in opposite directions.

The integrated circuit device 100 may include a plurality of gate lines 134 longitudinally extending in the vertical direction (Z direction) on the substrate 102 to face the sidewalls 110S of each of the plurality of semiconductor layers 110. The plurality of gate lines 134 may configure the plurality of word lines WL illustrated in FIG. 1.

A gate insulating layer 132 is interposed between the gate line 134 and the channel region CH of the semiconductor layer 110. The gate insulating layer 132 and the gate line 134 facing the sidewalls 110S of each of the plurality of semiconductor layers 110 may constitute a gate structure GS. One memory cell MC may include a pair of gate structures GS spaced apart from each other with the channel region CH of the semiconductor layer 110 interposed therebetween. The pair of gate structures GS may face each other in a mirror symmetric shape with respect to the channel region CH. As illustrated in FIG. 2B, each of the plurality of gate lines 134 may extend in a direction inclined with respect to the plane along the normal line of the main surface 102M of the substrate 102 as each of the plurality of gate lines 134 is away from the substrate 102. In an example embodiment, each of the plurality of gate lines 134 may longitudinally extend in a direction parallel to the sidewall 110S of the semiconductor layer 110.

In the integrated circuit device 100, one memory cell MC may include a transistor having a double gate structure including one semiconductor layer 110 and two gate lines 134 covering both sidewalls of the channel region CH included in the one semiconductor layer 110.

The gate insulating layer 132 may have a stacked structure of an interfacial layer and a high dielectric layer. The interfacial layer may include a low dielectric material layer having a dielectric constant of about 9 or less, for example, a silicon oxide layer, a silicon oxynitride layer, or a combination thereof. In an example embodiment, the interfacial layer may be omitted. The high dielectric layer may include a material having a larger dielectric constant than that of the silicon oxide layer. For example, the high dielectric layer may have a dielectric constant of about 10 to about 25. The high dielectric layer may include, for example, hafnium oxide, hafnium silicon oxide, zirconium oxide, zirconium silicon oxide, or a combination thereof.

Each of the plurality of gate lines 134 may include, for example, a doped semiconductor, a metal, a conductive metal nitride, a conductive metal carbide, or a combination thereof. The metal may be selected from, for example, Ti, W, Ru, Nb, Mo, Hf, Ni, Co, Pt, Yb, Tb, Dy, Er, and Pd. The conductive metal nitride may be selected from, for example, TiN and TaN. The conductive metal carbide may be, for example, TiAlC. In an example embodiment, the plurality of gate lines 134 may have a stacked structure of a conductive barrier layer and a metal layer. For example, the conductive barrier layer may include TiN or TaN, and the metal layer may include W.

The integrated circuit device 100 may include a plurality of intermediate insulating layers 124 interposed one by one between the plurality of semiconductor layers 110. The plurality of intermediate insulating layers 124 may overlap the plurality of semiconductor layers 110 in the vertical direction (Z direction). The plurality of intermediate insulating layers 124 may have a constant thickness LK1 in the vertical direction (Z direction) as the plurality of intermediate insulating layers 124 is disposed farther away from the substrate 102. In an example embodiment, each of the plurality of intermediate insulating layers 124 may have a thickness selected within a range of, for example, about 5 nm to about 500 nm in the vertical direction (Z direction). For example, each of the plurality of intermediate insulating layers 124 may have a thickness selected within a range of about 10 nm to about 100 nm. The plurality of intermediate insulating layers 124 may include, for example, a silicon oxide layer, a silicon nitride layer, a silicon oxynitride layer, a carbon-containing silicon oxide layer, a carbon-containing silicon nitride layer, a carbon-containing silicon oxynitride layer, or a combination thereof.

The integrated circuit device 100 may include a plurality of capacitors 170 in contact with one end of the plurality of semiconductor layers 110 in the first horizontal direction (X direction). The plurality of capacitors 170 may be interposed one by one between the plurality of intermediate insulating layers 124 overlapping in the vertical direction (Z direction). The plurality of capacitors 170 may include a plurality of first electrode layers 172 interposed one by one between the plurality of intermediate insulating layers 124 overlapping in the vertical direction (Z direction), a dielectric layer 174 conformally covering a surface of each of the plurality of first electrode layers 172 and a sidewall of each of the plurality of intermediate insulating layers 124, and a second electrode layer 176 facing the plurality of first electrode layers 172 with the dielectric layer 174 interposed therebetween. The plurality of first electrode layers 172 overlapping in the vertical direction (Z direction) on the substrate 102 may share one dielectric layer 174 and one second electrode layer 176.

The plurality of capacitors 170 overlapping in the vertical direction (Z direction) on the substrate 102 may have different thicknesses in the vertical direction (Z direction). In an example embodiment, the farther the plurality of capacitors 170 are away from the substrate 102, the greater thicknesses of the plurality of capacitors 170 in the vertical direction (Z direction) may be. In an example embodiment, the farther the plurality of capacitors 170 are away from the substrate 102 in the vertical direction (Z direction), the greater the thicknesses of the plurality of capacitors 170 in the vertical direction (Z direction) may be. For example, a first thickness CK1 of the capacitor 170 of the lowest level closest to the substrate 102 among the plurality of capacitors 170 may be the smallest. Among the plurality of capacitors 170, a second thickness CKn of the capacitor 170 of the highest level farthest from the substrate 102 may be the largest. The thickness of each of the other capacitors 170 disposed between the capacitor 170 of the lowest level and the capacitor 170 of the highest level among the plurality of capacitors 170 may be selected within a range greater than the first thickness CK1 and smaller than the second thicknesses CKn, and may gradually increase as each of the other capacitors 170 is away from the substrate 102.

In the plurality of capacitors 170, each of the plurality of first electrode layers 172 and the second electrode layers 176 may include a metal layer, a conductive metal oxide layer, a conductive metal nitride layer, a conductive metal oxynitride layer, or a combination thereof. In an example embodiment, each of the plurality of first electrode layers 172 and the second electrode layer 176 may include, for example, Ti, Ti oxide, Ti nitride, Ti oxynitride, Co, Co oxide, Co nitride, Co oxynitride, Nb, Nb oxide, Nb nitride, Nb oxynitride, Sn, Sn oxide, Sn nitride, Sn oxynitride, or a combination thereof. For example, each of the plurality of first electrode layers 172 and the second electrode layers 176 may include TiN, CoN, NbN, $SnO_2$, or a combination thereof. The dielectric layer 174 may include a high dielectric layer. For example, the dielectric layer 174 may include $HfO_2$, $ZrO_2$, $Al_2O_3$, $La_2O_3$, $Ta_2O_3$, $Nb_2O_5$, $CeO_2$, $TiO_2$, $GeO_2$, or a combination thereof.

As illustrated in FIGS. 2A to 2C, a lower insulating layer 104 may be interposed between the substrate 102 and the plurality of semiconductor layers 110, and the plurality of semiconductor layers 110 may be covered by an upper insulating layer 120. The plurality of gate lines 134 may include two gate lines 134 interposed between the two semiconductor layers 110 adjacent to each other in the second horizontal direction (Y direction). A space between the two gate lines 134 may be filled with a buried insulating layer 136. As illustrated in FIG. 2A, a plurality of vertical insulating patterns 140 may be interposed between the gate line 134 and the capacitor 170 in the space between the two semiconductor layers 110 adjacent to each other in the second horizontal direction (Y direction). The plurality of vertical insulating patterns 140 may cover both sidewalls of the gate line 134 in the first horizontal direction (X direction) and both sidewalls of the buried insulating layer 136 in the first horizontal direction (X direction).

The bit line BL may be covered with a bit line buried insulating layer 160. Each of the bit line BL and the bit line buried insulating layer 160 may longitudinally extend in the second horizontal direction (Y direction). In an example embodiment, the bit line BL may include, for example, doped polysilicon, metal, conductive metal nitride, metal silicide, or a combination thereof. The metal silicide may be, for example, tungsten silicide, cobalt silicide, or titanium silicide.

Each of the lower insulating layer 104, the upper insulating layer 120, the buried insulating layer 136, the vertical insulating pattern 140, and the bit line buried insulating layer 160 may include, for example, a silicon oxide layer, a silicon nitride layer, or a silicon oxynitride layer.

According to the integrated circuit device 100 described with reference to FIGS. 2A through 2D, even when there is a width difference in the horizontal direction between the semiconductor layer 110 closest to and the semiconductor layer 110 farthest from the substrate 102 among the plurality of semiconductor layers 110 stacked in a line on the substrate 102 to overlap each other in the vertical direction (Z direction), because each of the semiconductor layers 110 has a structure in which the thickness of each of the semiconductor layers 110 in the vertical direction (Z direction) gradually increases as each of the other semiconductor layers 110 is away from the substrate 102, the cross-sectional area of each of the plurality of channel regions CH included in the plurality of semiconductor layers 110 may be substantially the same or similar. Accordingly, variations in electrical characteristics according to distances from the substrate 102 in the transistors included in the integrated circuit device 100 may be minimized.

Figure 9A:
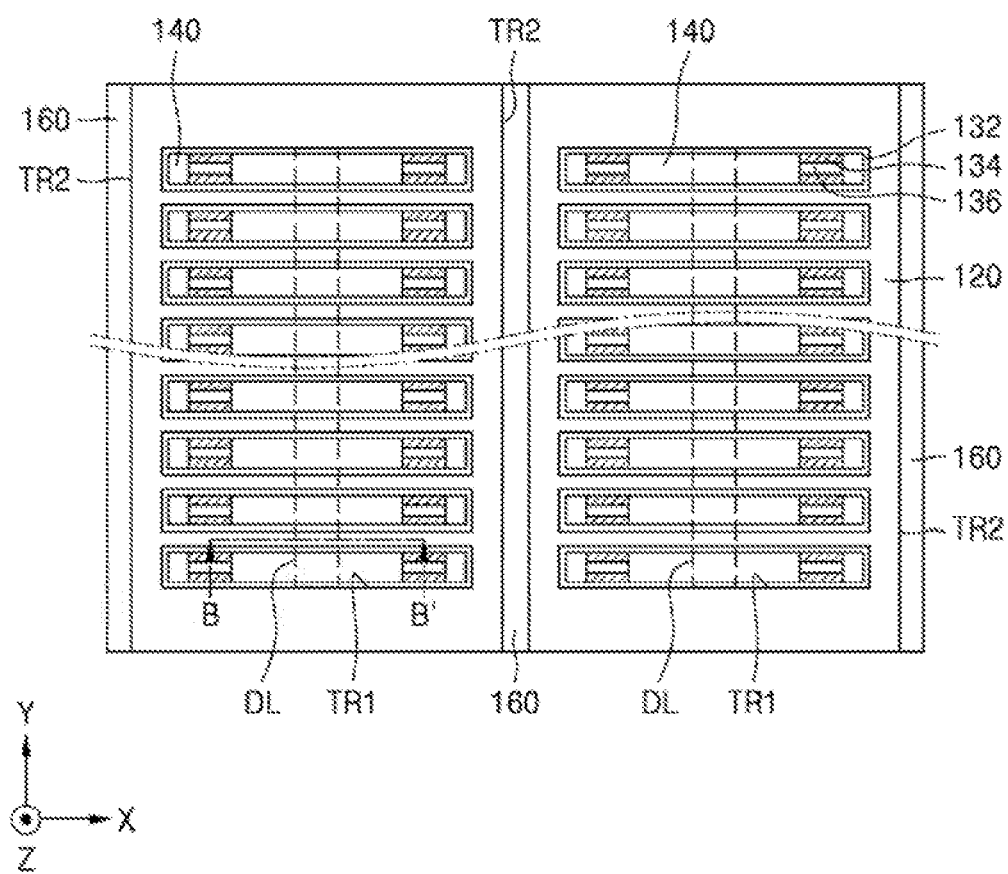
Figure 9B:
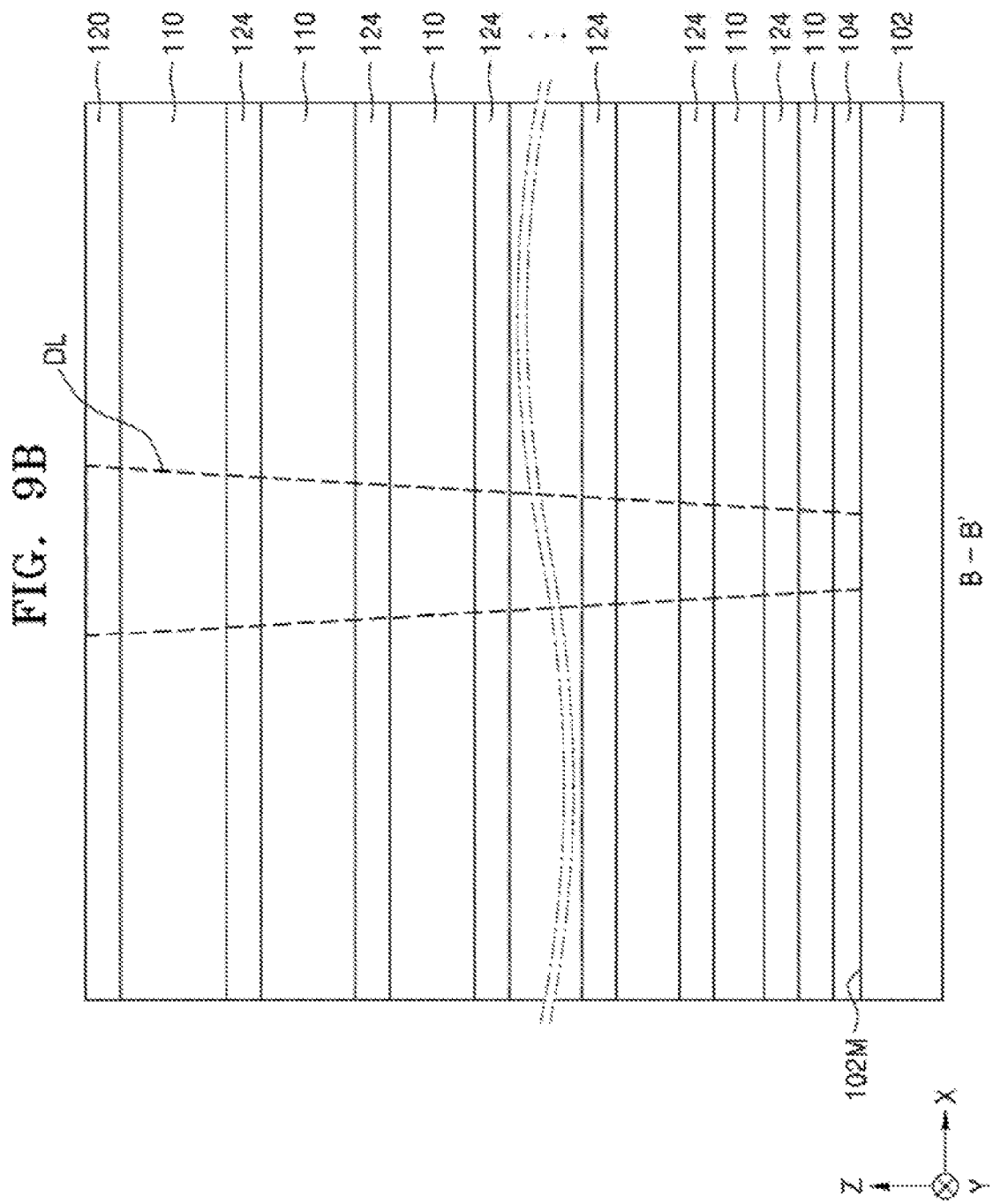

In addition, the farther the plurality of capacitors 170 overlapping on the substrate 102 in the vertical direction (Z direction) are away from the substrate 102, the greater thicknesses of the plurality of capacitors 170 in the vertical direction (Z direction) may be. The plurality of capacitors 170 may be obtained by substituting the plurality of capacitors 170 with a partial region of each of the plurality of semiconductor layers 110 from resultants of FIGS. 9A and 9B, as will described below with reference to FIGS. 10A to 10C. In the resultants of FIGS. 9A and 9B, even when the plurality of semiconductor layers 110 are farther away from the substrate 102, the width in the horizontal direction may be decreased such that even when the width of each of the plurality of capacitors 170 in the horizontal direction decreases, the farther the plurality of capacitors 170 are away from the substrate 102, the greater thicknesses of the plurality of capacitors 170 in the vertical direction (Z direction) are, and thus the capacitance dispersion according to the distances from the substrate 102 in the plurality of capacitors 170 included in the integrated circuit device 100 may be minimized.

Figure 3A:
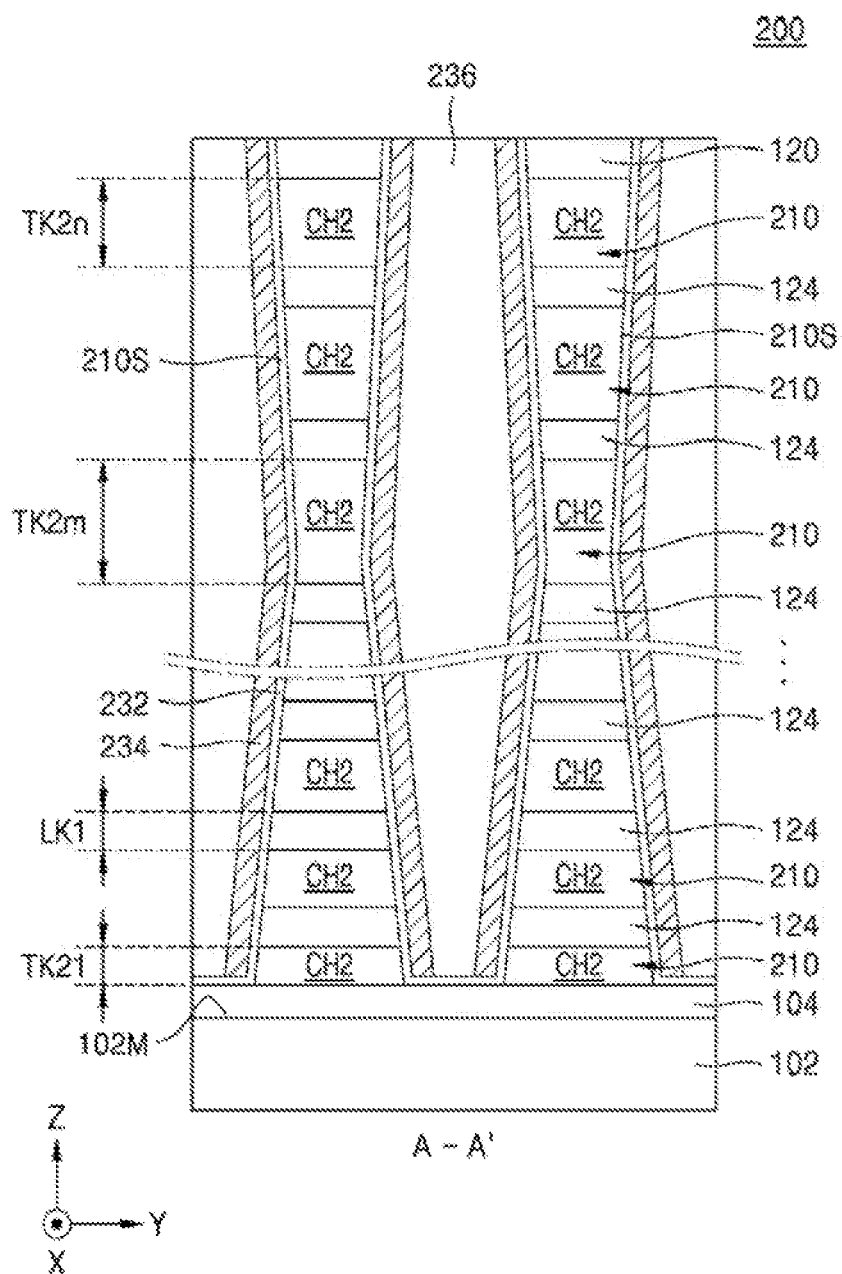
Figure 3B:
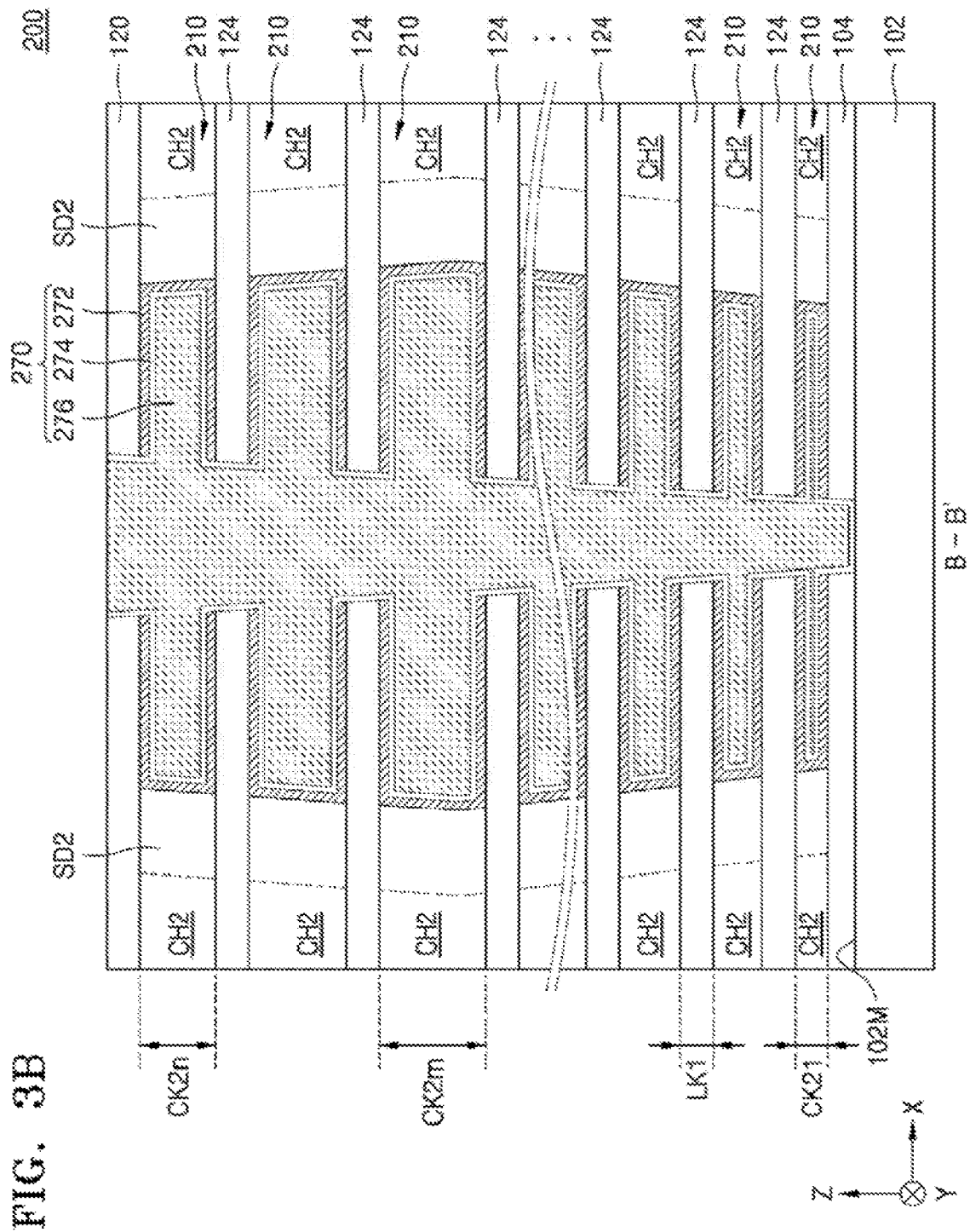

FIGS. 3A and 3B are diagrams for describing an integrated circuit device 200 according to an example embodiment. FIG. 3A is an enlarged cross-sectional view of a part corresponding to a cross-section taken along the line A-A' of FIG. 2A. FIG. 3B is an enlarged cross-sectional view of a part corresponding to a cross-section taken along the line B-B' of FIG. 2A. The integrated circuit device 200 illustrated in FIGS. 3A and 3B may configure the memory cell array MCA of the integrated circuit device 10 illustrated in FIG. 1.

The integrated circuit device 200 may have substantially the same configuration as the integrated circuit device 100 described with reference to FIGS. 2A through 2D. However, the integrated circuit device 200 includes a plurality of semiconductor layers 210 instead of the plurality of semiconductor layers 110. The plurality of semiconductor layers 210 have substantially the same configuration as described with respect to the plurality of semiconductor layers 110. However, among the plurality of semiconductor layers 210, the plurality of semiconductor layers 210 stacked in a line to overlap each other on the substrate 102 in the vertical direction (Z direction) may have different thicknesses in the vertical direction (Z direction), and the semiconductor layer 210 of a level between the semiconductor layer 210 of the lowest level closest to the substrate 102 and the semiconductor layer 210 of the highest level farthest from the substrate 102 may have a first thickness TK2$m$ that is the largest in the vertical direction (Z direction). Among the plurality of semiconductor layers 210 stacked in a line to overlap each other on the substrate 102 in the vertical direction (Z direction), a second thickness TK21 of the semiconductor layer 210 of the lowest level closest to the substrate 102 may be the smallest. Among the plurality of semiconductor layers 210 stacked in a line to overlap each other on the substrate 102 in the vertical direction (Z direction), a third thickness TK2$n$ of the semiconductor layer 210 of the highest level farthest from the substrate 102 may be smaller than the first thickness TK2$m$ and greater than the second thickness TK21. In an example embodiment, cross-sectional areas (along a plane parallel to the second horizontal direction (Y direction) and the vertical direction (Z direction)) of a plurality of channel regions CH2 included in the plurality of semiconductor layers 210 stacked in a line to overlap each other on the substrate 102 in the vertical direction (Z direction) may be substantially the same or similar.

In an example embodiment, the farther some of the plurality of semiconductor layers 210 stacked in the line to overlap each other on the substrate 102 in the vertical direction (Z direction) are away from the substrate 102 in the vertical direction (Z direction), the greater the thicknesses of the some semiconductor layers 210 in the vertical direction (Z direction) may be. For example, the farther the plurality of semiconductor layers 210 (between the semiconductor layer 210 of the lowest level closest to the substrate 102 and the semiconductor layer 210 of the largest first thickness TK2m among the plurality of semiconductor layers 210) are away from the substrate 102, the greater the thicknesses of the plurality of semiconductor layers 210 in the vertical direction (Z direction) may be.

The integrated circuit device 200 may include a plurality of gate lines 234 facing both sidewalls 210S of each of the plurality of semiconductor layers 210. The plurality of gate lines 234 may configure the plurality of word lines WL illustrated in FIG. 1. A gate insulating layer 232 may be interposed between the gate line 234 and the channel region CH2 of the semiconductor layer 210. As illustrated in FIG. 3A, each of the plurality of gate lines 234 may extend in a direction inclined with respect to a plane along the normal line of the main surface 102M of the substrate 102 as each of the plurality of gate lines 234 is disposed farther away from the substrate 102, and an inclination direction of each of the plurality of gate lines 234 may vary according to the height thereof on the substrate 102. Detailed configurations of the gate insulating layer 232 and the plurality of gate lines 234 may be generally the same as those described above with respect to the gate insulating layer 132 and the plurality of gate lines 134 illustrated in FIG. 2B.

The plurality of gate lines 234 may include two gate lines 234 interposed between the two semiconductor layers 210 adjacent to each other in a second horizontal direction (Y direction). A space between the two gate lines 234 may be filled with a buried insulating layer 236. The buried insulating layer 236 may include, for example, a silicon oxide layer, a silicon nitride layer, or a silicon oxynitride layer.

The integrated circuit device 200 may include a plurality of capacitors 270 in contact with one end of the plurality of semiconductor layers 210 in a first horizontal direction (X direction). The plurality of capacitors 270 may be interposed one by one between the plurality of intermediate insulating layers 124 overlapping in the vertical direction (Z direction). The plurality of capacitors 270 may include a plurality of first electrode layers 272, a dielectric layer 274, and a second electrode layer 276. The plurality of first electrode layers 272 overlapping in the vertical direction (Z direction) on the substrate 102 may share one dielectric layer 274 and one second electrode layer 276. Detailed configurations of the plurality of first electrode layers 272, the dielectric layer 274, and the second electrode layer 276 may be generally the same as those described with respect to the plurality of first electrode layers 172, the dielectric layer 174, and the second electrode layer 176. The plurality of capacitors 270 overlapping in the vertical direction (Z direction) on the substrate 102 may have different thicknesses in the vertical direction (Z direction). However, the capacitor 270 of a level between the capacitor 270 of the lowest level closest to the substrate 102 and the capacitor 270 of the highest level farthest from the substrate 102 may have a first thickness CK2m that is the largest in the vertical direction (Z direction). Among the plurality of capacitors 270 stacked in a line to overlap each other on the substrate 102 in the vertical direction (Z direction), a second thickness CK21 of the capacitor 270 of the lowest level closest to the substrate 102 may be the smallest. Among the plurality of capacitors 270 stacked in the line to overlap each other on the substrate 102 in the vertical direction (Z direction), a third thickness CK2n of the capacitor 270 of the highest level farthest from the substrate 102 may be smaller than the first thickness CK2m and greater than the second thickness CK21. In an example embodiment, the farther some of the plurality of capacitors 270 stacked in the line to overlap each other on the substrate 102 in the vertical direction (Z direction) are away from the substrate 102, the greater the thicknesses of the some capacitors 270 in the vertical direction (Z direction) may be.

According to the integrated circuit device 200 described with reference to FIGS. 3A and 3B, similarly to described with respect to the integrated circuit device 100 illustrated in FIGS. 2A through 2D, variations in electrical characteristics according to distances from the substrate 102 in the transistors of the plurality of memory cells MC may be minimized, and the capacitance dispersion according to the distances from the substrate 102 in the plurality of capacitors 270 included in the integrated circuit device 200 may be minimized.

Figure 10A:
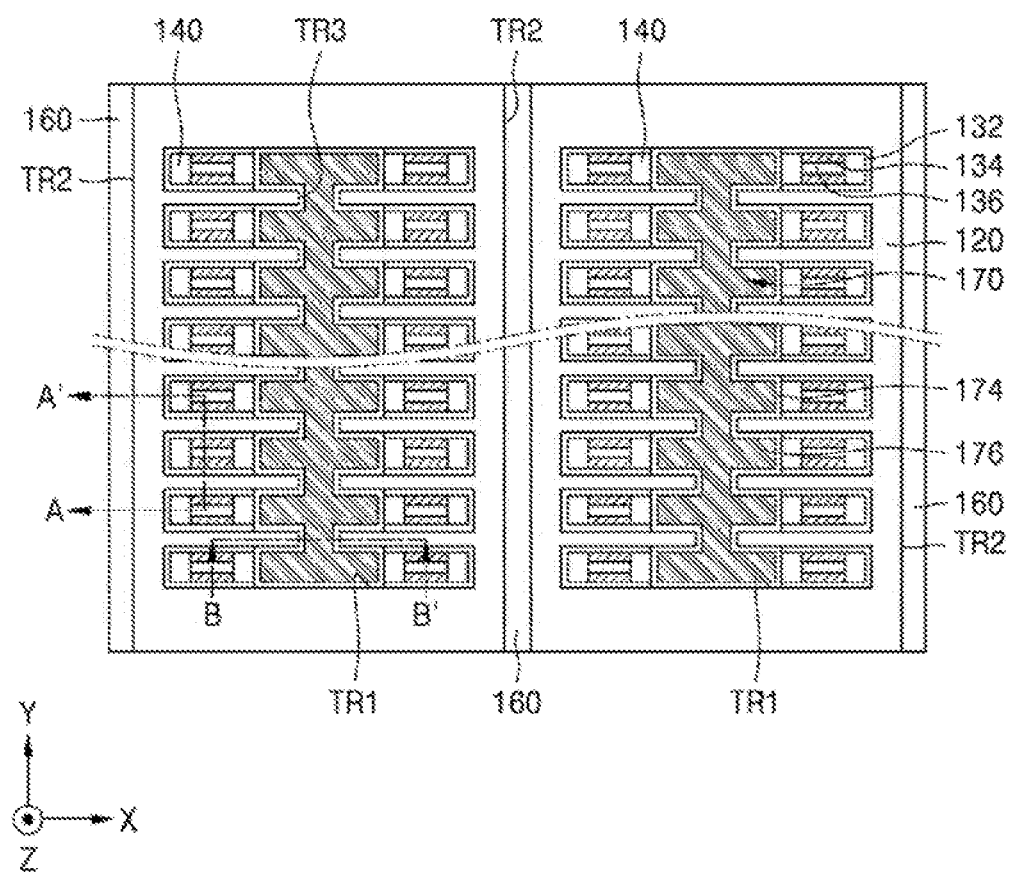
Figure 10B:
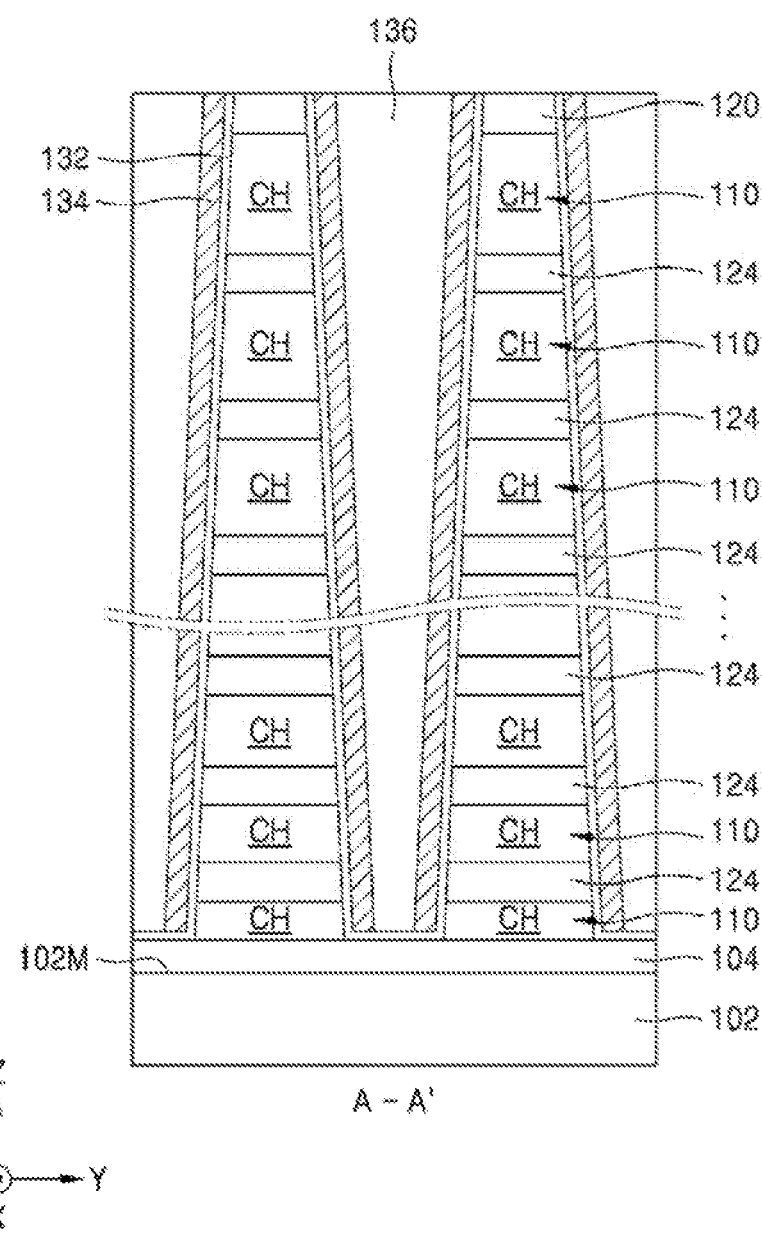
Figure 10C:
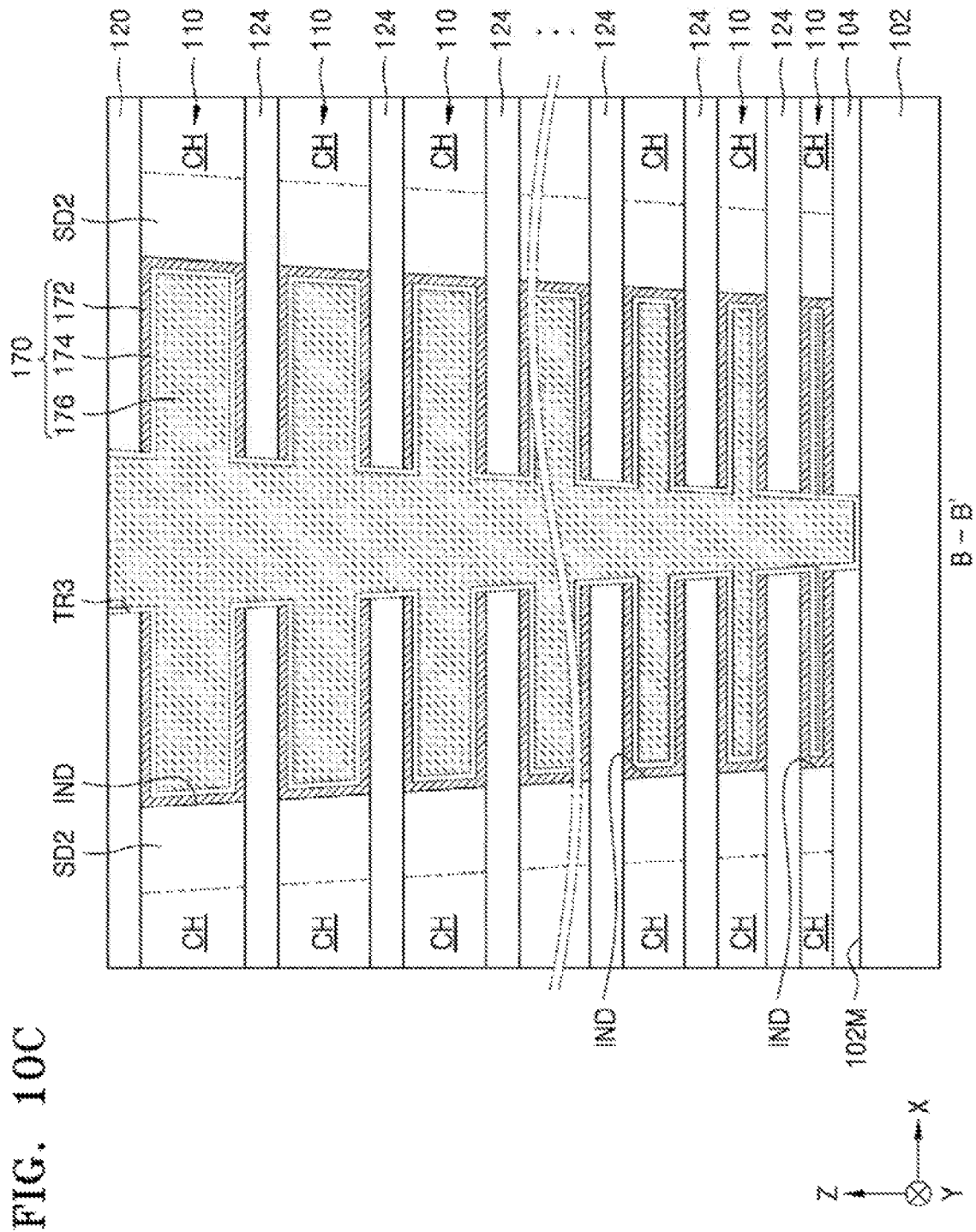

FIGS. 4A to 10C are diagrams for describing a method of manufacturing an integrated circuit device according to an example embodiment. FIGS. 4A, 5A, 6A, 7A, 8A, 9A, and 10A are plan views illustrating the method of manufacturing the integrated circuit device. FIGS. 4B, 5B, 6B, 7B, 8B, and 10B are enlarged cross-sectional views of the line A-A' of FIGS. 4A, 5A, 6A, 7A, 8A, and 10A, respectively. FIG. 9B and FIG. 10C are enlarged cross-sectional views of the line B-B' of FIGS. 9A and 10A, respectively. An example method of manufacturing the integrated circuit device 100 illustrated in FIGS. 2A through 2D will be described with reference to FIGS. 4A through 10C.

Figure 4A:
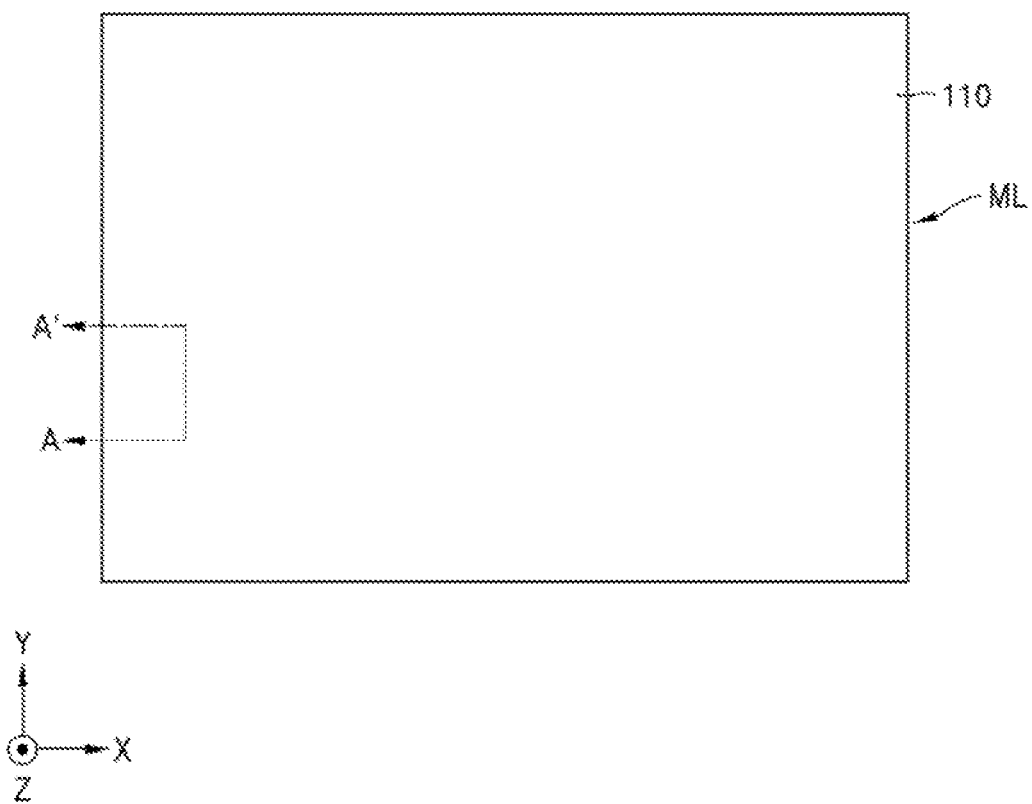
Figure 4B:
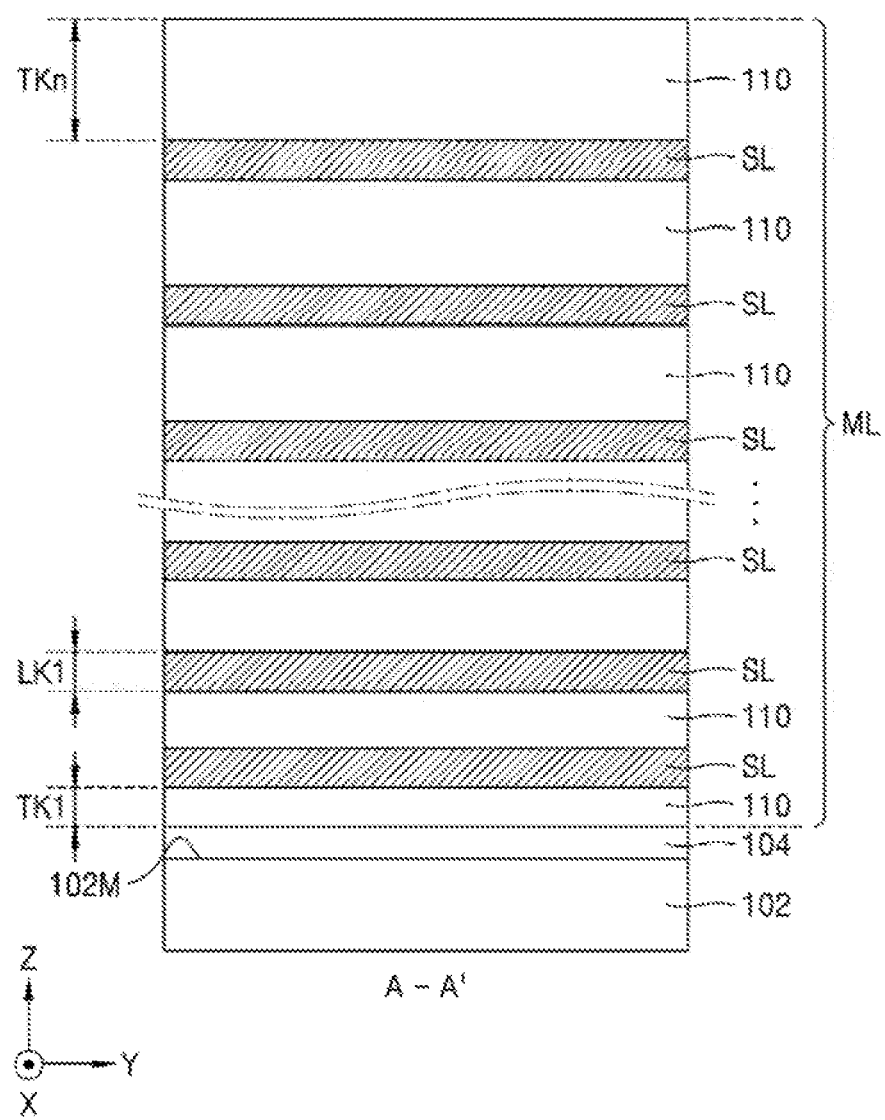
FIGS. 4B, 5B, 6B, 7B, 8B, and 10B are enlarged cross-sectional views of the line A-A' of FIGS. 4A, 5A, 6A, 7A, 8A, and 10B, respectively.

Referring to FIGS. 4A and 4B, the lower insulating layer 104 may be formed on the main surface 102M of the substrate 102, and a mold layer ML including the plurality of semiconductor layers 110 and a plurality of sacrificial layers SL may be formed on the lower insulating layer 104. The top surface of the semiconductor layer 110 of the highest level farthest from the substrate 102 among the plurality of semiconductor layers 110 may form the uppermost surface of the mold layer ML.

The mold layer ML may have a structure in which the plurality of semiconductor layers 110 and the plurality of sacrificial layers SL are alternately stacked one by one. The plurality of semiconductor layers 110 may have different thicknesses in the vertical direction (Z direction). In an example embodiment, the farther the plurality of semiconductor layers 110 are away from the substrate 102 in the vertical direction (Z direction), the greater the thicknesses of the plurality of semiconductor layers 110 in the vertical direction (Z direction) may be. For example, the first thickness TK1 of the semiconductor layer 110 of the lowest level closest to the substrate 102 among the plurality of semiconductor layers 110 may be the smallest, and among the plurality of semiconductor layers 110, the second thickness TKn of the semiconductor layer 110 of the highest level farthest from the substrate 102 may be the largest. The thickness of each of the other semiconductor layers 110 disposed between the semiconductor layer 110 of the lowest level and the semiconductor layer 110 of the highest level among the plurality of semiconductor layers 110 may be selected within a range greater than the first thickness TK1 and smaller than the second thicknesses TKn, and may gradually increase as each of the other semiconductor layers 110 is away from the substrate 102. The plurality of sacrificial layers SL may have the constant thickness LK1 in the vertical direction (Z direction) as the plurality of sacrificial layers SL is disposed farther away from the substrate 102. In an example embodiment, the plurality of semiconductor layers 110 may have different thicknesses selected within the range of about 5 nm to about 500 nm in the vertical direction (Z direction). For example, the plurality of semiconductor layers 110 may have different thicknesses selected within the range of about 10 nm to about 100 nm. Each of the plurality of sacrificial layers SL may have the constant thickness LK1 selected within the range of about 5 nm to about 500 nm in the vertical direction (Z direction). For example, each of the plurality of sacrificial layers SL may have the constant thickness LK1 selected within the range of about 10 nm to about 100 nm.

Each of the plurality of semiconductor layers 110 and the plurality of sacrificial layers SL constituting the mold layer ML may be formed by, for example, an epitaxial growth process. In an example embodiment, the plurality of semiconductor layers 110 and the plurality of sacrificial layers SL may include a crystalline semiconductor or a crystalline semiconductor compound. In an example embodiment, the plurality of semiconductor layers 110 may include a first semiconductor material selected from, for example, Si, Ge, SiGe, and Indium Gallium Zinc Oxide (IGZO), and the plurality of sacrificial layers SL may include a second semiconductor material different from the first semiconductor material. For example, each of the plurality of semiconductor layers 110 may include a Si layer, and each of the plurality of sacrificial layers SL may include a SiGe layer. The Ge content ratio in the plurality of sacrificial layers SL may be constant. The SiGe layer constituting each of the plurality of sacrificial layers SL may have the same Ge content ratio in the range of about 5 atomic % to about 60 atomic %. For example, the SiGe layer constituting each of the plurality of sacrificial layers SL may have the same Ge content ratio in the range of about 10 atomic % to about 40 atomic %. In an example, the SiGe layer constituting each of the plurality of sacrificial layers SL may include $Si_{0.65}Ge_{0.35}$. In another example, the SiGe layer constituting each of the plurality of sacrificial layers SL may include $Si_{0.75}Ge_{0.25}$. However, the SiGe layer constituting each of the plurality of sacrificial layers SL may be within various ranges. In other example embodiments, each of the plurality of sacrificial layers SL may include an insulating material.

Figure 5A:
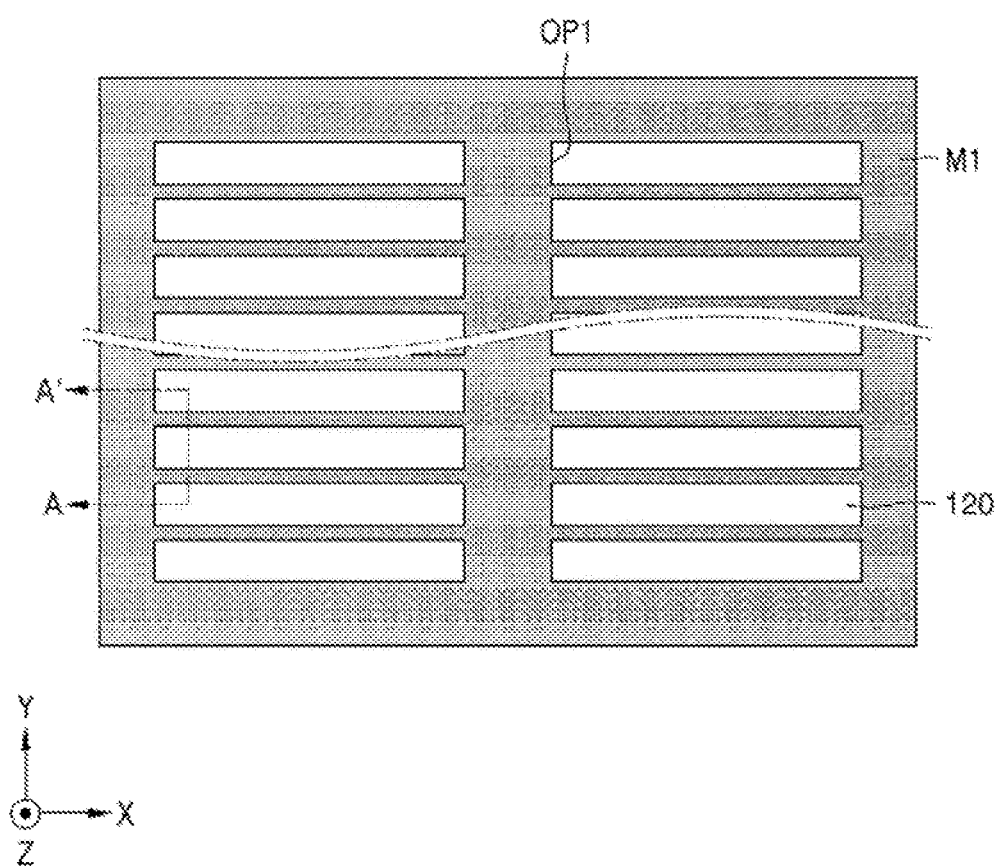
Figure 5B:
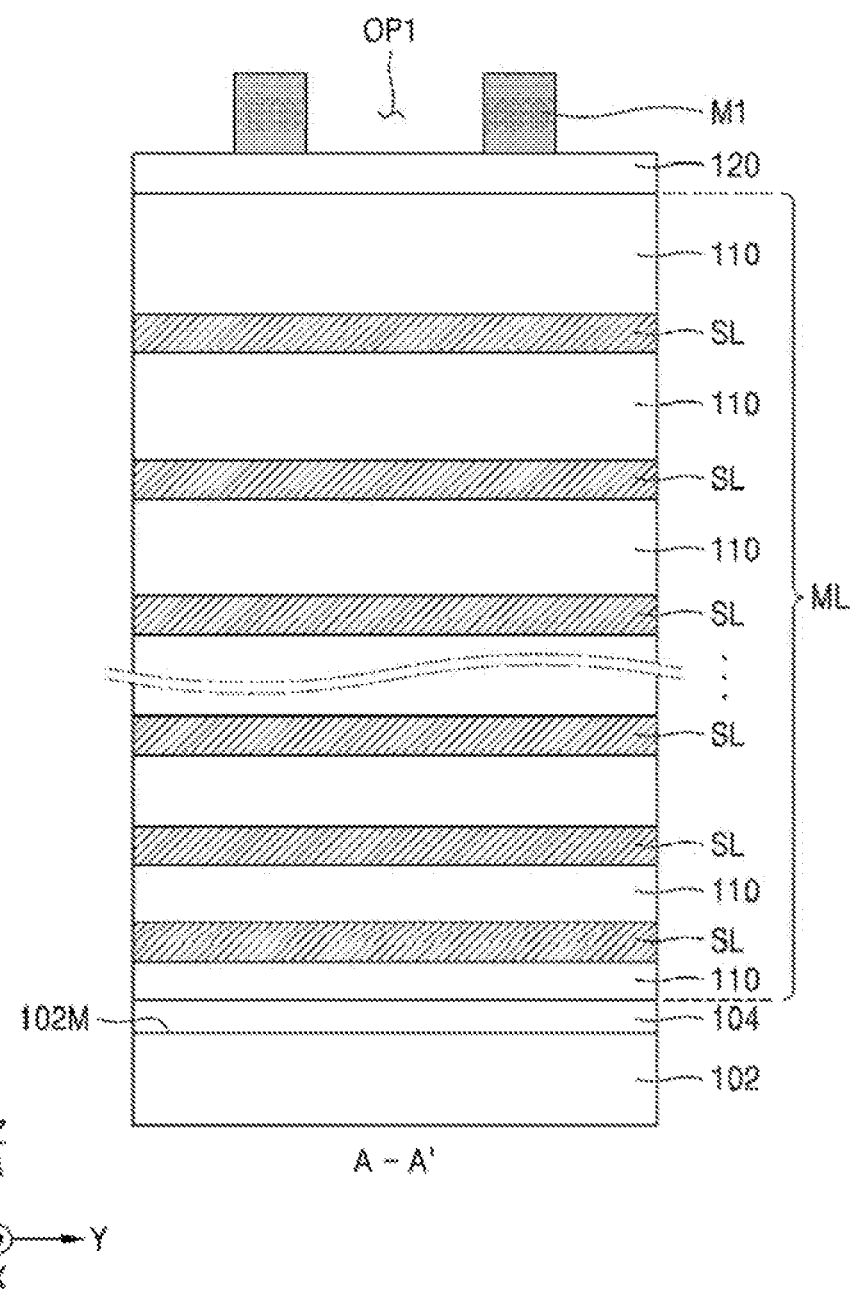

Referring to FIGS. 5A and 5B, the upper insulating layer 120 may be formed on the mold layer ML, and a mask pattern M1 including a plurality of openings OP1 may be formed on the upper insulating layer 120. The upper insulating layer 120 may be exposed through the plurality of openings OP1.

The mask pattern M1 may include an antireflection film pattern and a photoresist pattern. In an example embodiment, the antireflection film pattern may include an organic compound, an inorganic compound, or a combination thereof. For example, the antireflection film pattern may include silicon nitride, silicon oxynitride, amorphous silicon, titanium, titanium dioxide, titanium nitride, chromium oxide, carbon, an organic anti-reflective coating (ARC) material, or a combination thereof. The photoresist pattern may include, for example, a resist for extreme ultraviolet (EUV) (13.5 nm), a resist for KrF excimer laser (248 nm), a resist for ArF excimer laser (193 nm), or a resist for $F_2$ excimer laser (157 nm).

Figure 6A:
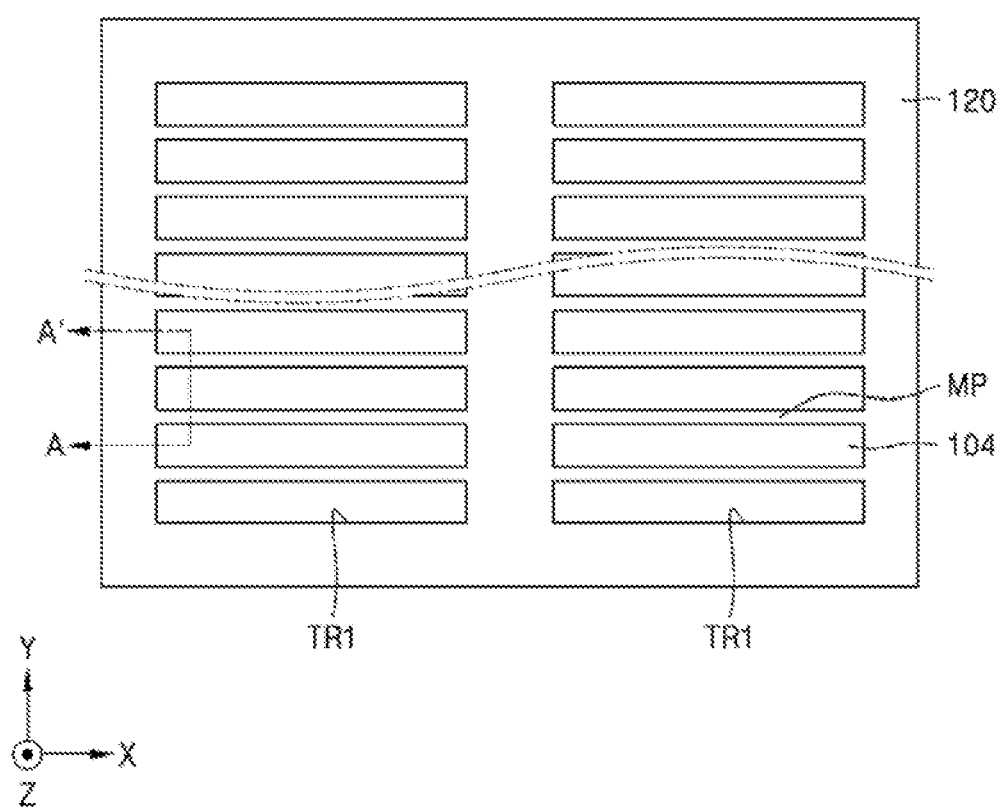
Figure 6B:
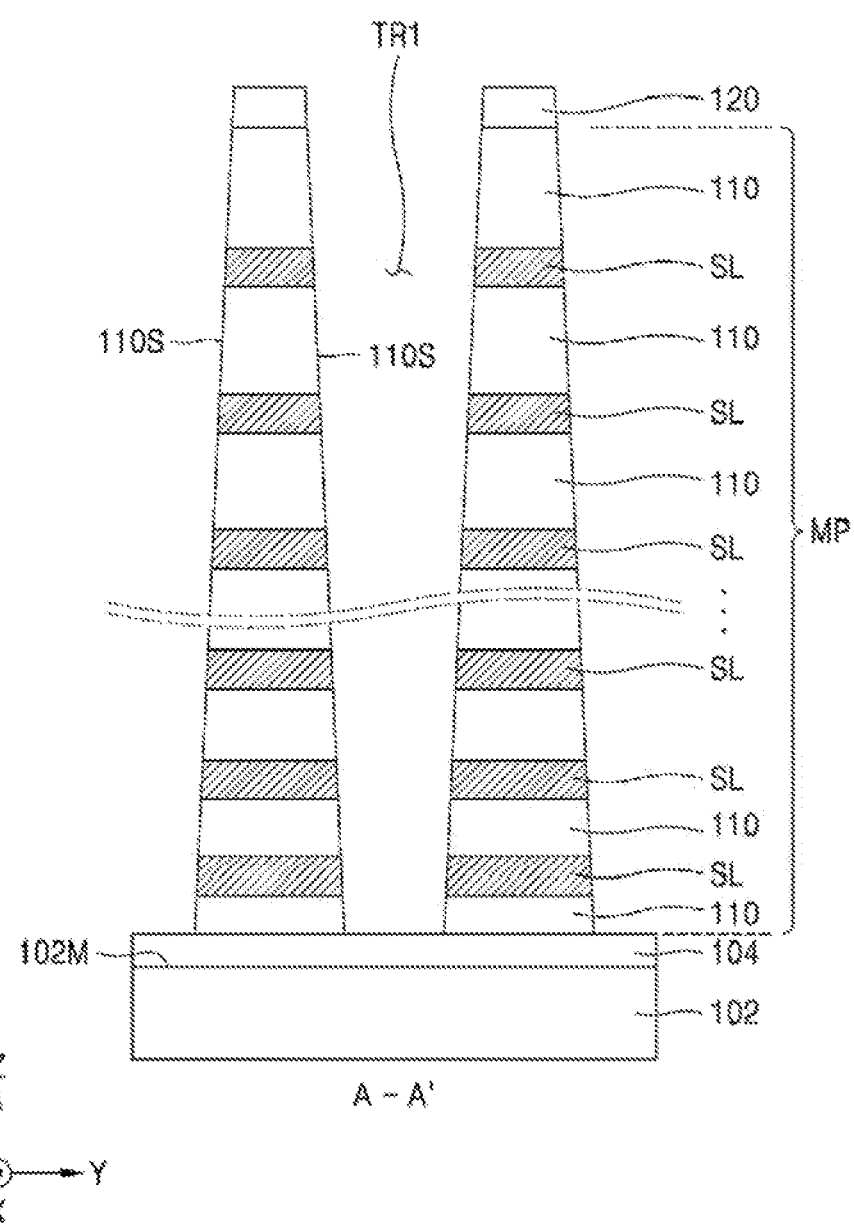

Referring to FIGS. 6A and 6B, a plurality of first trenches TR1 longitudinally extending in a first horizontal direction (X direction) and a plurality of mold patterns MP longitudinally extending in the first horizontal direction (X direction) may be formed by anisotropically etching the upper insulating layer 120 and the mold layer ML through the plurality of openings OP1 using the mask pattern M1 as an etching mask in the resultant of FIGS. 5A and 5B and passing through the upper insulating layer 120 and the mold layer ML. The lower insulating layer 104 may be exposed through the plurality of first trenches TR1. The plurality of first trenches TR1 may not penetrate the lower insulating layer 104, and thus, the substrate 102 may not be exposed through the plurality of first trenches TR1. The plurality of mold patterns MP may include the plurality of semiconductor layers 110 and the plurality of sacrificial layers SL. The upper insulating layer 120 may partially remain on the plurality of mold patterns MP.

The plurality of first trenches TR1 may have a line shape longitudinally extending in the first horizontal direction (X direction). The plurality of first trenches TR1 may be repeatedly spaced apart from each other in the first horizontal direction (X direction) and the second horizontal direction (Y direction). The width of the channel region CH (see FIG. 2B) included in the plurality of semiconductor layers 110 in the second horizontal direction (Y direction) may be determined according to the plurality of first trenches TR1.

After the plurality of first trenches TR1 is formed, the sidewalls 110S of each of the plurality of semiconductor layers 110 remaining on the plurality of mold patterns MP may be formed as the inclined surface to form an angle greater than 0 with respect to a plane along a normal line of the main surface 102M of the substrate 102, and may have the shape inclined in opposite directions. The width of each of the plurality of semiconductor layers 110 remaining on the plurality of mold patterns MP in the second horizontal direction (Y direction) may gradually decrease as each of the plurality of semiconductor layers 110 is disposed farther away from the substrate 102.

In anisotropically etching the mold layer ML (see FIG. 5B) to form the plurality of mold patterns MP, the cross-sectional area (along a plane parallel to the second horizontal direction (Y direction) and the vertical direction (Z direction)) of each of the plurality of semiconductor layers 110 stacked in a line to overlap each other on the substrate 102 in the vertical direction among the plurality of semiconductor layers 110 constituting the plurality of mold patterns MP may be constant.

Figure 7A:
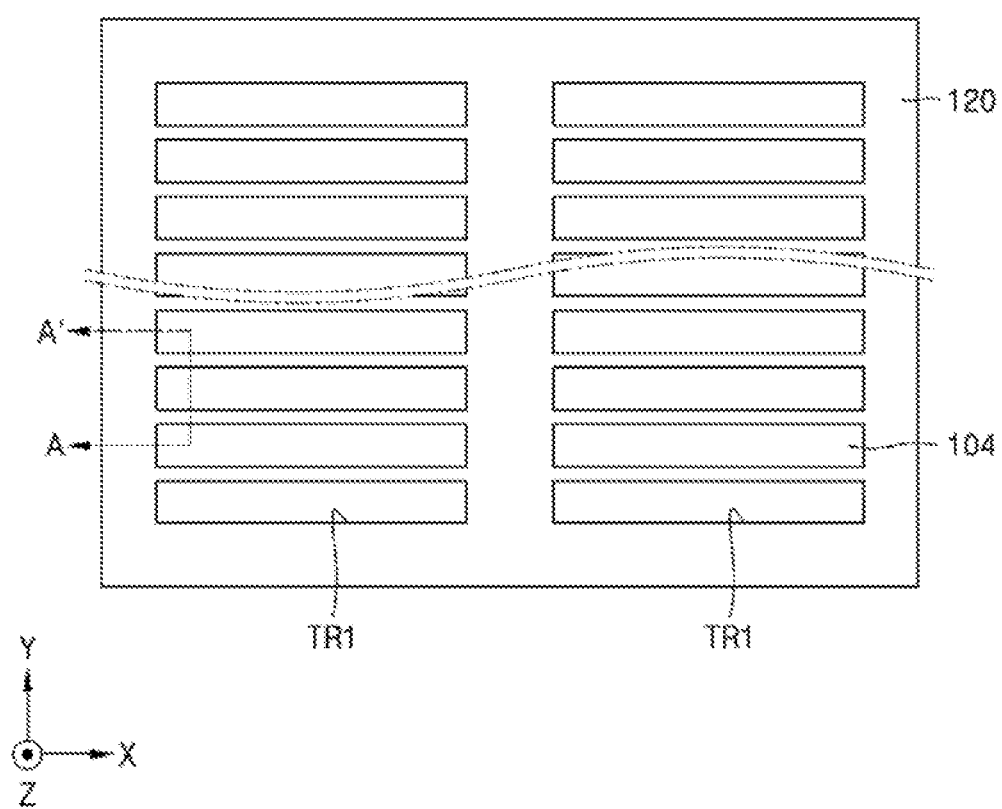
Figure 7B:
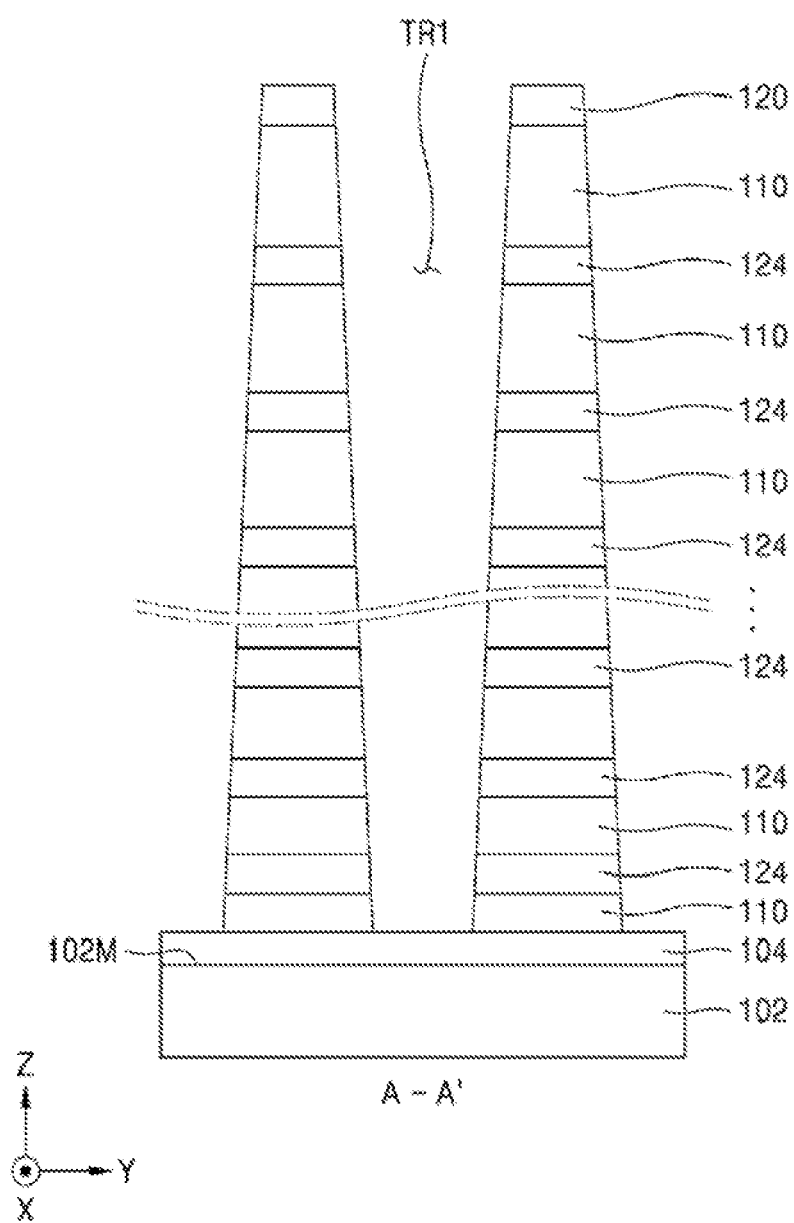

Referring to FIGS. 7A and 7B, in the resultant of FIGS. 6A and 6B, the plurality of sacrificial layers SL included in the mold pattern MP may be substituted with the plurality of intermediate insulating layers 124.

In an example embodiment, in order to substitute the plurality of sacrificial layers SL with the plurality of intermediate insulating layers 124, after selectively removing the plurality of sacrificial layers SL included in the mold pattern MP in the resultant of FIGS. 6A and 6B through the plurality of first trenches TR1 and preparing empty spaces between the plurality of semiconductor layers 110 arranged in the vertical direction (Z direction), an insulating layer may be formed (for example, using an atomic layer deposition (ALD) process to fill the empty spaces between the plurality of semiconductor layers 110), excess parts of the insulating layer may be removed, and the plurality of intermediate insulating layers 124 may remain between the plurality of semiconductor layers 110 arranged in the vertical direction (Z direction).

In an example embodiment, in order to selectively remove the plurality of sacrificial layers SL, an etching selectivity difference between the plurality of semiconductor layers 110 and the plurality of sacrificial layers SL may be used. In order to selectively remove the plurality of sacrificial layers SL, a liquid or a gaseous etchant may be included. For example, in order to selectively remove the plurality of sacrificial layers SL, a $CH_3COOH$-based etchant, for example, an etchant including a mixture of $CH_3COOH$, $HNO_3$, and HF, or a mixture of $CH_3COOH$, $H_2O_2$, and HF may be used.

Figure 8A:
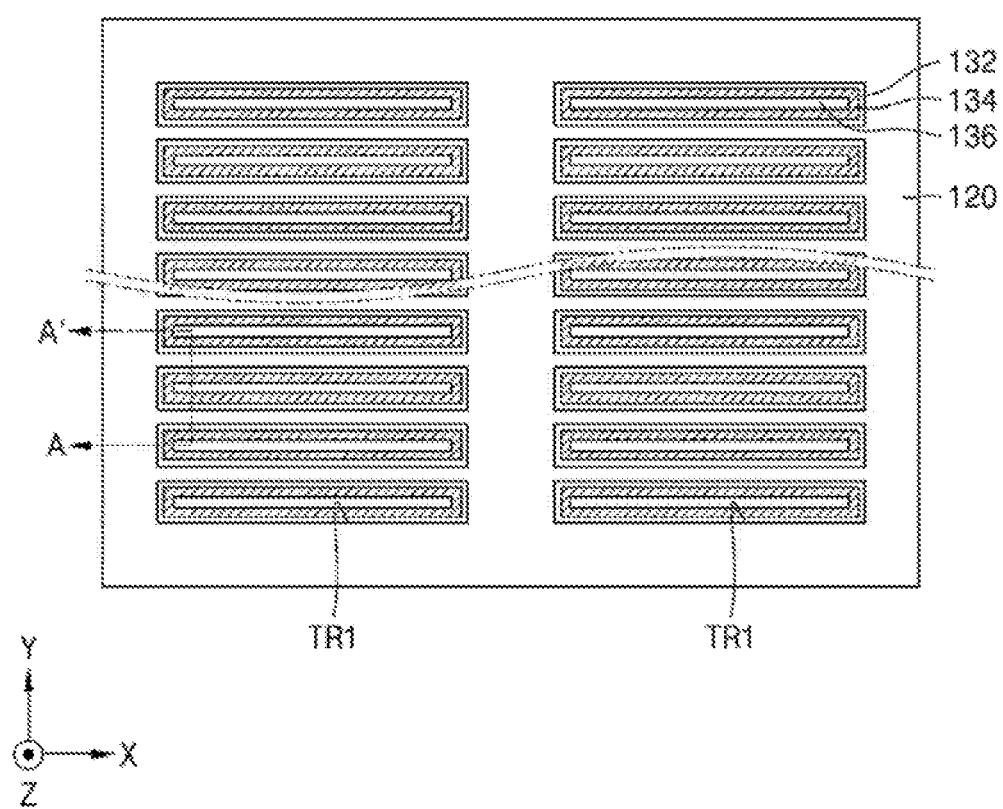
Figure 8B:
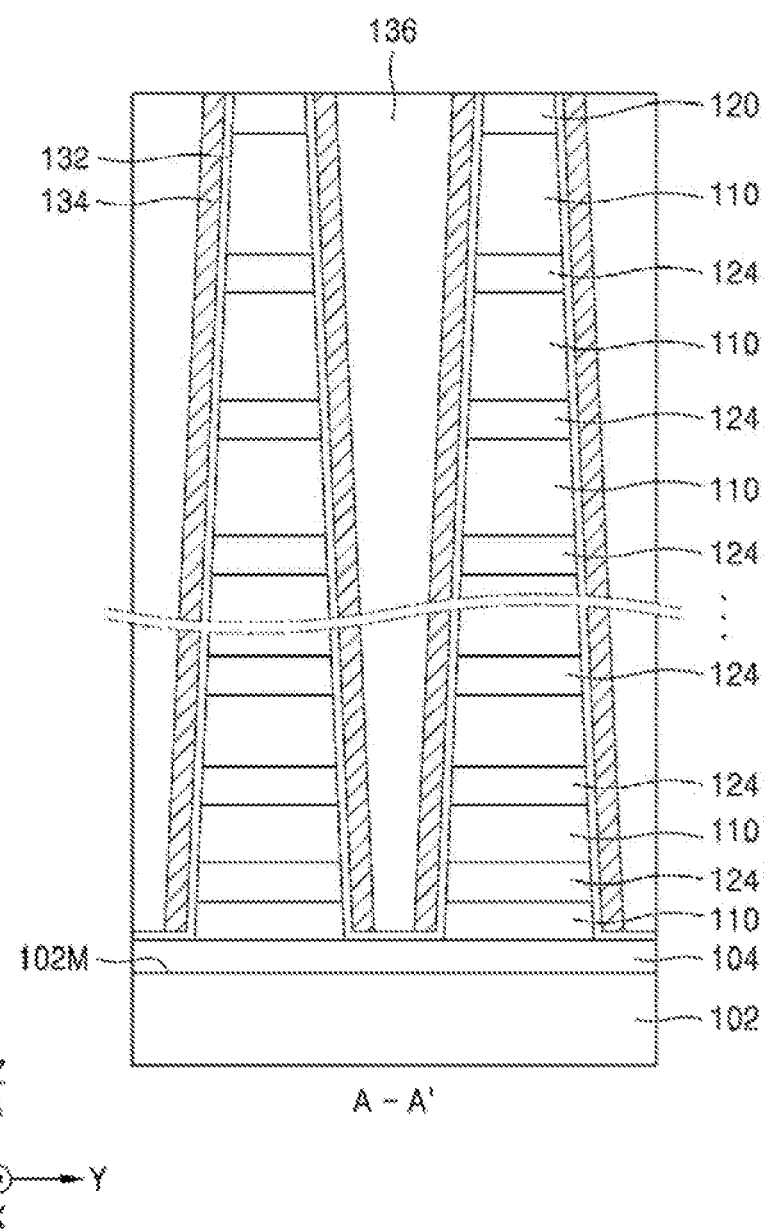

Referring to FIGS. 8A and 8B, the gate insulating layer 132 may be formed to conformally cover a sidewall of each of the plurality of semiconductor layers 110 and a sidewall of each of the plurality of intermediate insulating layers 124 exposed through the plurality of first trenches TR1 in the resultant of FIGS. 7A and 7B, and the gate line 134 may be formed on the gate insulating layer 132 to conformally cover the gate insulating layer 132 in the plurality of first trenches TR1. Then, a part of each of the gate insulating layer 132 and the gate line 134 may be removed such that the top surface of the upper insulating layer 120 is exposed and the gate insulating layer 132 is exposed at the bottom surface of each of the plurality of first trenches TR1. In an example embodiment, the ALD process may be used to form the gate insulating layer 132 and the plurality of gate lines 134.

Thereafter, the buried insulating layer 136 may be formed on the gate line 134 to fill the plurality of first trenches TR1. The top surface of the buried insulating layer 136 may be planarized to extend on the same plane as the top surface of the upper insulating layer 120.

Referring to FIGS. 9A and 9B, after a mask pattern (not shown) is formed on the resultant of FIGS. 8A and 8B, the gate line 134 and the buried insulating layer 136 covering both sidewalls of each of the plurality of semiconductor layers 110 in the second horizontal direction (Y direction) may be processed to remain only in a partial region of each of the plurality of semiconductor layers 110 by removing excess parts of the gate line 134 and the buried insulating layer 136 using the mask pattern as an etch mask. A part of the semiconductor layer 110 covered by the gate line 134 may be the channel region CH (see FIGS. 2B and 2C) and a partial region around the channel region CH.

Thereafter, the plurality of vertical insulating patterns 140 may be formed to fill the remaining spaces in the plurality of first trenches TR1. The plurality of vertical insulating patterns 140 may cover both sidewalls of each of the gate line 134 and the buried insulating layer 136 in the plurality of first trenches TR1. The plurality of vertical insulating patterns 140 may include parts surrounded by the gate insulating layer 132 in the plurality of first trenches TR1.

A plurality of second trenches TR2 disposed at positions spaced apart from the plurality of first trenches TR1 on both sides of each of the plurality of first trenches TR1 in the first horizontal direction (X direction) and longitudinally extending in the second horizontal direction (Y direction) may be formed, and a plurality of spaces partially exposing the top surfaces of the plurality of semiconductor layers 110 may be prepared by removing a part of each of the plurality of intermediate insulating layers 124 exposed through the plurality of second trenches TR2. Then the source/drain region SD1 (see FIG. 2D) may be formed in each of the plurality of semiconductor layers 110 by doping the plurality of semiconductor layers 110 with impurities through the plurality of spaces. Thereafter, the bit line BL (see FIGS. 1 and 2D) in contact with the source/drain region SD1 may be formed by filling a part of each of the plurality of spaces with a conductive material, for example, metal. The plurality of bit lines BL may be formed to be connectable only to the plurality of semiconductor layers 110 at one horizontal level on a substrate, respectively. For example, the bottom surface of each of the plurality of bit lines BL may be in contact with the top surface of the source/drain region SD1 formed in each of the plurality of semiconductor layers 110. After the plurality of bit lines BL is formed, the plurality of second trenches TR2 may be filled with the bit line buried insulating layer 160.

Referring to FIGS. 10A, 10B, and 10C, a partial region of each of the plurality of semiconductor layers 110 may be substituted with each of the plurality of capacitors 170 in the resultant of FIGS. 9A and 9B. For example, a plurality of third trenches TR3 exposing the substrate 102 may be formed by removing a part of each of the upper insulating layer 120, the plurality of semiconductor layers 110, the plurality of intermediate insulating layers 124, and the lower insulating layer 104 from regions indicated by a dotted line DL in FIGS. 9A and 9B, and the width of each of the plurality of semiconductor layers 110 in the first horizontal direction (X direction) may be reduced by removing a part of each of the plurality of semiconductor layers 110 exposed from inner sidewalls of the plurality of third trenches TR3. As a result, a plurality of indent regions IND exposing one end of the plurality of semiconductor layers 110 with the reduced width may be formed between the lower insulating layer 104 and the intermediate insulating layer 124 of the lowest level, between the plurality of intermediate insulating layers 124, and between the intermediate insulating layer 124 of the highest level and the upper insulating layer 120. The height of the indent region IND of the lowest level among the plurality of indent regions IND in the vertical direction (Z direction) may be defined by the lower insulating layer 104 and the intermediate insulating layer 124 of the lowest level. The height of the indent region IND of the highest level among the plurality of indent regions IND in the vertical direction (Z direction) may be defined by the intermediate insulating layer 124 of the highest level and the upper insulating layer 120. The height of each of the plurality of indent regions IND between the indent region IND of the lowest level and the indent region IND of the highest level among the plurality of indent regions IND in the vertical direction (Z direction) may be defined by two intermediate insulating layers 124 adjacent to each other in the vertical direction (Z direction).

In addition, at parts of the plurality of third trenches TR3 overlapping the plurality of first trenches TR1, the width of each of the plurality of third trenches TR3 in the first horizontal direction (X direction) may be expanded by removing some of the plurality of vertical insulating patterns 140 and some of the gate insulating layers 132 exposed through the plurality of third trenches TR3.

The source/drain region SD2 may be formed by doping a partial region of each of the plurality of semiconductor layers 110 exposed through the plurality of indent regions IND with impurities. A part of each of the plurality of semiconductor layers 110 except the source/drain regions SD1 and SD2 may be the channel region CH.

The plurality of capacitors 170 may be formed in the plurality of indent regions IND. In an example embodiment, in order to form the plurality of capacitors 170, first, as illustrated in FIG. 10C, the plurality of first electrode layers 172 conformally covering an exposed surface of each of the plurality of semiconductor layers 110 and the intermediate insulating layer 124 exposed in the plurality of indent regions IND may be formed. The plurality of first electrode layers 172 may be in contact with the source/drain regions SD2 formed in the plurality of semiconductor layers 110. Subsequently, the dielectric layer 174 conformally covering surfaces exposed through the plurality of third trenches TR3 may be formed. The dielectric layer 174 may conformally cover a surface of each of the plurality of first electrode layers 172 exposed through the plurality of third trenches TR3, a surface of each of the intermediate insulating layers 124, a surface of each of the plurality of upper insulating layers 120, and a surface of the substrate 102 exposed at the bottom surface of each of the plurality of third trenches TR3. Thereafter, the second electrode layer 176 filling the remaining space of each of the plurality of indent regions IND and the plurality of third trenches TR3 may be formed.

The plurality of capacitors 170 may have different thicknesses in the vertical direction (Z direction). In an example embodiment, the farther the plurality of capacitors 170 are away from the substrate 102, the greater thicknesses of the plurality of capacitors 170 in the vertical direction (Z direction) may be.

According to the method of manufacturing the integrated circuit device 100 described with reference to FIGS. 4A through 10C, variations in electrical characteristics according to distances from the substrate 102 in the transistors constituting the plurality of memory cells MC (see FIG. 2D) included in the integrated circuit device 100 may be minimized. In addition, the capacitance dispersion according to the distances from the substrate 102 in the plurality of capacitors 170 constituting the plurality of memory cells MC (see FIG. 2D) included in the integrated circuit device 100 may be minimized.

Figure 11A:
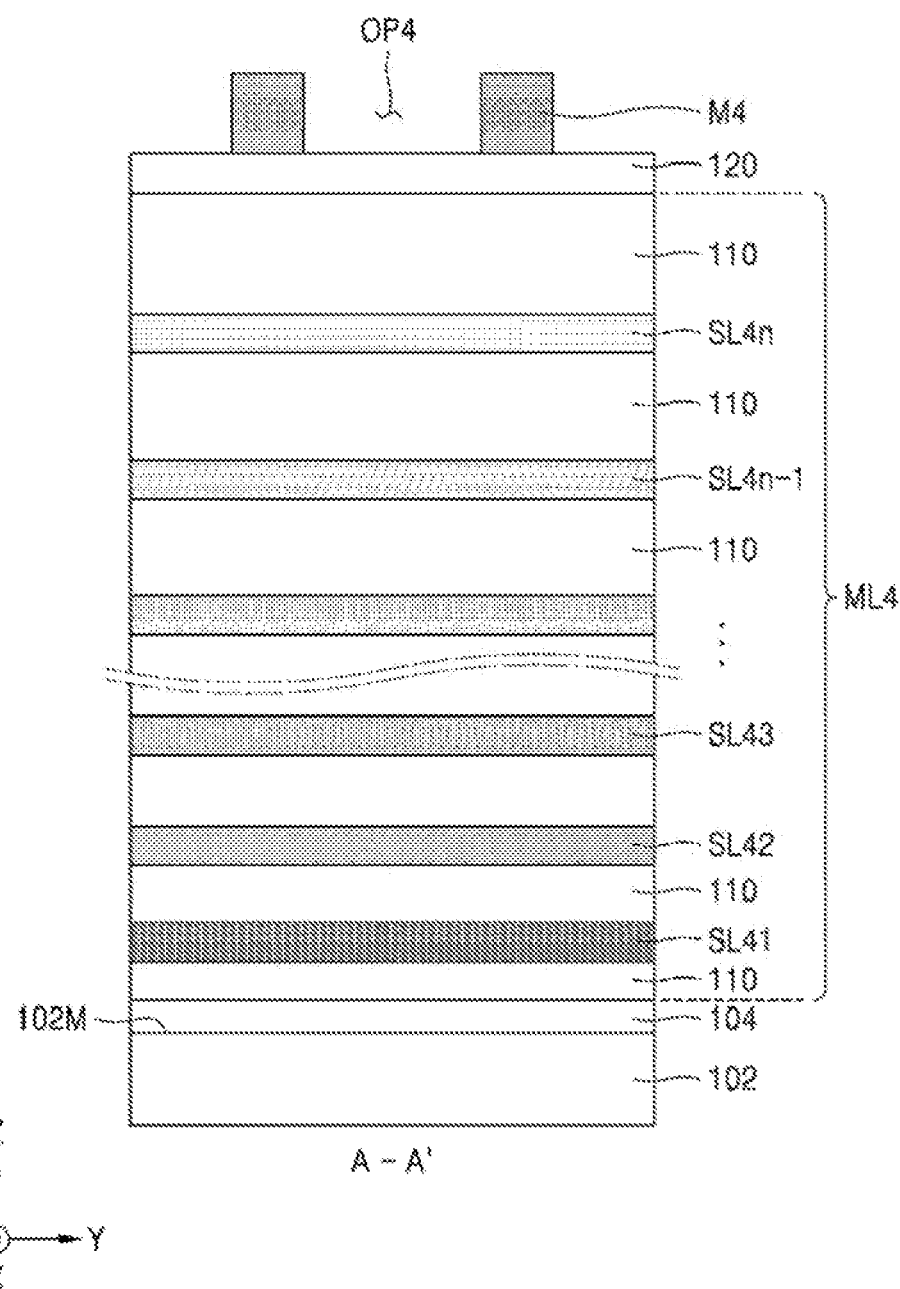
FIGS. 11A and 11B are cross-sectional views illustrating a method of manufacturing an integrated circuit device in a process order according to an example embodiment.
Figure 11B:
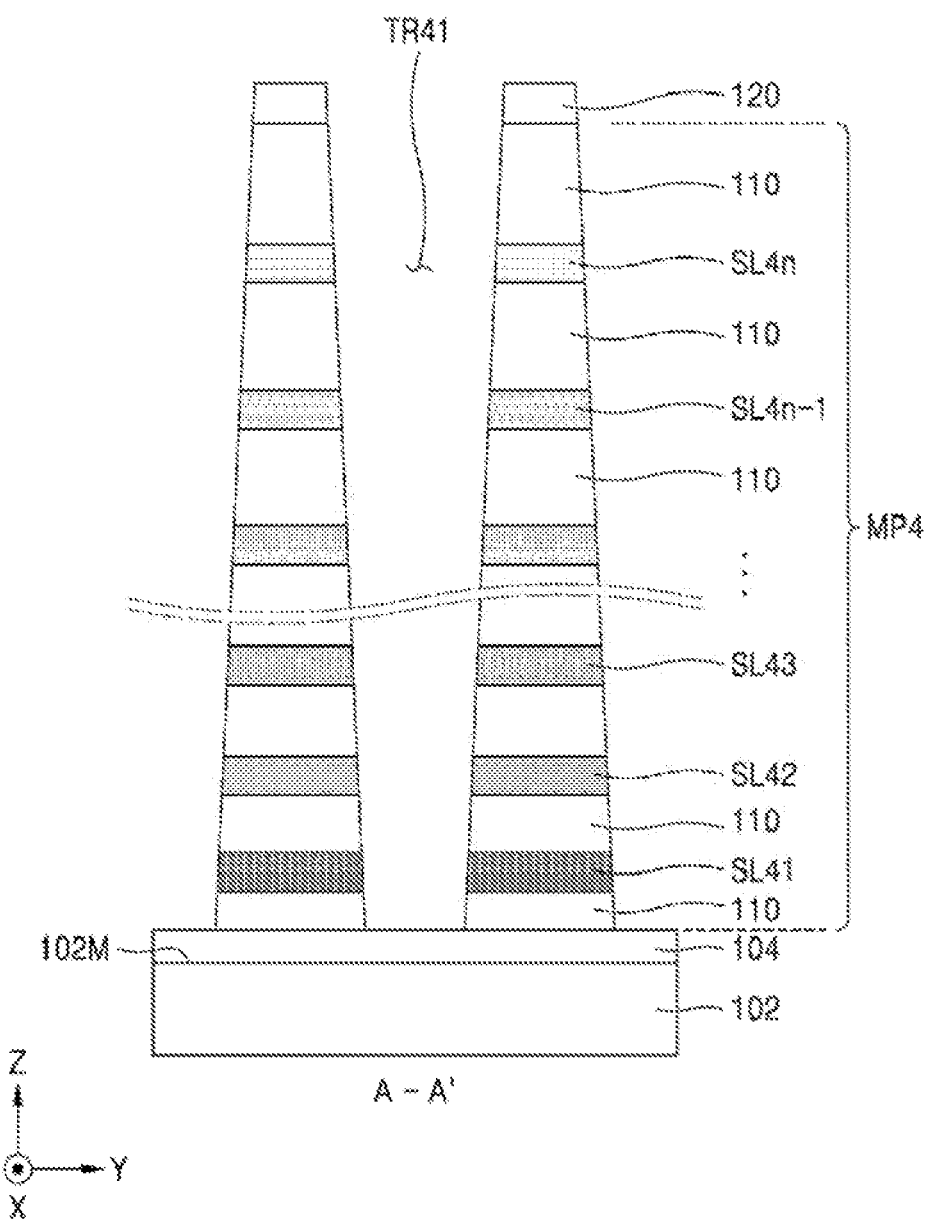

FIGS. 11A and 11B are cross-sectional views illustrating a method of manufacturing an integrated circuit device in a process order according to an example embodiment. FIGS. 11A and 11B illustrate enlarged cross-sectional configurations of a part corresponding to a cross-section taken along the line A-A' of FIG. 2A in a process order.

Referring to FIG. 11A, in a similar manner as described with reference to FIGS. 4A and 4B, the lower insulating layer 104 may be formed on the main surface 102M of the substrate 102, and the mold layer ML4 may be formed on the lower insulating layer 104. The mold layer ML4 may have a structure in which the plurality of semiconductor layers 110 and a plurality of sacrificial layers SL41, SL42, . . . , SL4$n$-1, and SL4$n$ are alternately stacked one by one. The plurality of sacrificial layers SL41, SL42, . . . , SL4$n$-1, and SL4$n$ may include a compound semiconductor, and content ratios of elements constituting the compound semiconductor may differ from each other according to a vertical distance from the substrate 102.

The plurality of semiconductor layers 110 may have different thicknesses in the vertical direction (Z direction). Detailed configurations of the plurality of semiconductor layers 110 may be the same as described above with reference to FIGS. 2A to 2D.

In an example embodiment, the plurality of semiconductor layers 110 may include a first semiconductor material selected from Si, Ge, SiGe, and IGZO, and the plurality of sacrificial layers SL41, SL42, SL4$n$-1, and SL4$n$ may include a second semiconductor material different from the first semiconductor material. For example, each of the plurality of semiconductor layers 110 may include a Si layer, each of the plurality of sacrificial layers SL41, SL42, . . . , SL4$n$-1, and SL4$n$ may include a SiGe layer, and in the plurality of sacrificial layers SL41, SL42, . . . , SL4$n$-1, and SL4$n$, the Ge content ratio may be different. The plurality of sacrificial layers SL41, SL42, . . . , SL4$n$-1, and SL4$n$ may have different Ge content ratios selected from the range of about 5 atomic % to about 60 atomic %. The closer the plurality of sacrificial layers SL41, SL42, . . . , SL4$n$-1, and SL4$n$ are to the substrate 102, the greater the Ge content ratio of the plurality of sacrificial layers SL41, SL42, . . . , SL4$n$-1, and SL4$n$ may be. For example, the SiGe layer constituting the plurality of sacrificial layers SL may have a Ge content ratio selected in the range of about 10 atomic % to about 40 atomic %. In an example, the sacrificial layer SL41 of the lowest level closest to the substrate 102 among the plurality of sacrificial layers SL41, SL42, . . . , SL4$n$-1, and SL4$n$ may include $Si_{0.60}Ge_{0.40}$, the sacrificial layer SL4$n$ of the highest level farthest from the substrate 102 may include $Si_{0.75}Ge_{0.25}$, and each of the other sacrificial layers SL42, . . . , SL4$n$-1 between the sacrificial layer SL41 of the lowest level and the sacrificial layer SL4$n$ of the highest level may include a SiGe layer having a Ge content ratio that gradually decreases as the vertical distance from the substrate 102 increases within the range lower than the Ge content ratio of the sacrificial layer SL41 of the lowest level and higher than the Ge content ratio of the sacrificial layer SL4$n$ of the highest level.

In an example embodiment, the plurality of sacrificial layers SL41, SL42, . . . , SL4$n$-1, and SL4$n$ may include a compound indicated by SiGeX (where X is selected from B, P, C, N, and As), and the closer the plurality of sacrificial layers SL41, SL42, . . . , SL4$n$-1, and SL4$n$ are to the substrate 102, the greater the Ge content ratio of the plurality of sacrificial layers SL41, SL42, . . . , SL4$n$-1, and SL4$n$ may be.

The plurality of sacrificial layers SL41, SL42, . . . , SL4$n$-1, and SL4$n$ may have a constant thickness of about 5 nm to about 500 nm in the vertical direction (Z direction). For example, the plurality of sacrificial layers SL41, SL42, . . . , SL4$n$-1, and SL4$n$ may have a constant thickness selected within the range of about 10 nm to about 100 nm.

In a similar manner as described with reference to FIGS. 5A and 5B, the upper insulating layer 120 may be formed on the mold layer ML4, and the mask pattern M4 including a plurality of openings OP4 may be formed on the upper insulating layer 120. A detailed configuration of the mask pattern M4 may be the same as described above with respect to the mask pattern M1 with reference to FIGS. 5A and 5B.

Referring to FIG. 11B, in a similar manner as described with reference to FIGS. 6A and 6B, a plurality of mold patterns MP4 longitudinally extending in a first horizontal direction (X direction) and a plurality of first trenches TR41 may be formed by anisotropically etching the upper insulating layer 120 and the mold layer ML through the plurality of openings OP4 using a mask pattern M4 as an etching mask in the resultant of FIG. 11A, and the mask pattern M4 remaining on the upper insulating layer 120 may be removed.

The lower insulating layer 104 may be exposed through the plurality of first trenches TR41. The plurality of mold patterns MP4 may include parts that remain after anisotropically etching each of the semiconductor layers 110 and the sacrificial layers SL41, SL42, SL4$n$-1, and SL4$n$.

In anisotropically etching the mold layer ML4 to form the plurality of mold patterns MP4, an etching atmosphere may be used in which the greater the Ge content ratio of each of the plurality of sacrificial layers SL41, SL42, . . . , SL4$n$-1, and SL4$n$ is, the higher the etching rate may be. For example, the etching atmosphere may include an etching gas including $NH_3$, HF, and Ar, an etching gas including $NH_3$, $ClF_3$, and Ar, an etching gas including $CF_4$ and Ar, or an etching gas including $Cl_2$, $BCl_3$, and Ar may be included.

As described above, the sidewall of the mold pattern MP4 may be obtained by anisotropically etching the mold layer ML4 using the etching atmosphere in which the greater the Ge content ratio of the SiGe layer, and the etching rate may be higher closer to a plane along a normal line of the main surface 102M of the substrate 102 relative to the sidewall of the mold pattern MP illustrated in FIG. 6B. Therefore, the width difference along the second horizontal direction Y at the bottom and the top surfaces of the mold pattern MP4 may be minimized.

Then, in a similar manner as described with reference to FIGS. 7A and 7B, the sacrificial layers SL41, SL42, ..., SL4n−1, and SL4n included in the mold pattern MP4 may be substituted with the plurality of intermediate insulating layers 124 in the resultant of FIG. 11B, and then processes described with reference to FIGS. 8A through 10C may be performed to manufacture an integrated circuit device.

As described above, example methods of manufacturing integrated circuit devices have been described with reference to FIGS. 6A through 11B, but integrated circuit devices of various structures may be manufactured through various modifications and changes. For example, in order to manufacture the integrated circuit device 200 illustrated in FIGS. 3A and 3B, a mold layer including the plurality of semiconductor layers 210 instead of the plurality of semiconductor layers 110 may be formed in the process of forming the mold layer ML described with reference to FIGS. 4A and 4B, and the plurality of semiconductor layers 210 having a cross-sectional profile as shown in FIGS. 3A and 3B may remain by controlling etching process conditions in the process of forming the plurality of first trenches TR1 described with reference to FIGS. 6A and 6B. With respect to the resultant obtained as a result, the integrated circuit device 200 illustrated in FIGS. 3A and 3B may be manufactured by performing the processes described with reference to FIGS. 7A to 10C.

As described above, embodiments relate to an integrated circuit device including a three-dimensional semiconductor memory device including a semiconductor layer and a method of manufacturing the integrated circuit device. Embodiments may provide a structure capable of minimizing the distribution of electrical characteristics of a memory cell according to a height difference of the vertical direction in a three-dimensional semiconductor memory device and a method of implementing the structure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing an integrated circuit device, the method comprising:
   forming a mold layer in which a plurality of semiconductor layers and a plurality of sacrificial layers are alternately stacked one by one on a substrate, wherein the plurality of semiconductor layers have different thicknesses in a vertical direction;
   forming a plurality of first trenches penetrating the plurality of semiconductor layers and the plurality of sacrificial layers, and a plurality of mold patterns longitudinally extending along a first horizontal direction by anisotropically etching the mold layer; and
   after the forming of the plurality of mold patterns, substituting parts of the plurality of semiconductor layers with a plurality of capacitors,
   wherein the plurality of capacitors have different thicknesses in the vertical direction.

2. The method as claimed in claim 1, wherein in the forming of the mold layer, the farther the plurality of semiconductor layers are away from the substrate, the greater thicknesses of the plurality of semiconductor layers in the vertical direction are.

3. The method as claimed in claim 1, wherein, in the forming of the mold layer, each of the plurality of semiconductor layers includes a Si layer, each of the plurality of sacrificial layers includes a SiGe layer, and a Ge content ratio in the plurality of sacrificial layers is constant.

4. The method as claimed in claim 1, wherein, in the forming of the mold layer, each of the plurality of semiconductor layers includes a Si layer, each of the plurality of sacrificial layers includes a SiGe layer, and a Ge content ratio in the plurality of sacrificial layers is different.

5. The method as claimed in claim 1, wherein, in the forming of the mold layer, each of the plurality of semiconductor layers includes a Si layer, each of the plurality of sacrificial layers includes a SiGe layer, and the closer the plurality of sacrificial layers are to the substrate, the greater a Ge content ratio in the plurality of sacrificial layers is.

6. The method as claimed in claim 1, wherein, in the forming of the mold layer, the plurality of semiconductor layers and the plurality of sacrificial layers are formed by an epitaxial growth process.

7. The method as claimed in claim 1, wherein, in the forming of the mold layer, the plurality of semiconductor layers include a first semiconductor material selected from Si, Ge, SiGe, and Indium Gallium Zinc Oxide, and the plurality of sacrificial layers include a second semiconductor material different from the first semiconductor material.

8. The method as claimed in claim 1, wherein, in the forming of the plurality of mold patterns, sidewalls of each of the plurality of semiconductor layers exposed through the plurality of first trenches have an inclined surface forming an angle greater than 0 with respect to a plane along a normal line of a main surface of the substrate, and a width of each of the plurality of semiconductor layers in a second horizontal direction perpendicular to the first horizontal direction gradually decreases as the plurality of semiconductor layers are disposed away from the substrate.

9. The method as claimed in claim 1, further comprising, after the forming of the plurality of mold patterns and before the substituting of the parts of the plurality of semiconductor layers with the plurality of capacitors, substituting the plurality of sacrificial layers with a plurality of intermediate insulating layers.

10. A method of manufacturing an integrated circuit device, the method comprising:
   forming a mold layer in which a plurality of semiconductor layers having different thicknesses and a plurality of sacrificial layers having a constant thickness are alternately stacked one by one on a substrate;
   forming a mold pattern including a part of each of the plurality of semiconductor layers and the plurality of sacrificial layers by anisotropically etching the mold layer, the mold pattern longitudinally extending along a first horizontal direction;

exposing one end of a first part of each of the plurality of semiconductor layers by removing a second part of each of the plurality of semiconductor layers from the mold pattern; and forming a plurality of capacitors in contact with the one end of the first part of each of the plurality of semiconductor layers, wherein, in the forming of the plurality of capacitors, the farther the plurality of capacitors are away from the substrate, the greater thicknesses of the plurality of capacitors in a vertical direction are.

11. The method as claimed in claim 10, wherein, in the forming of the mold layer, the farther the plurality of semiconductor layers are away from the substrate, the greater thicknesses of the plurality of semiconductor layers in a vertical direction are.

12. The method as claimed in claim 10, wherein, in the forming of the mold pattern, the mold pattern is formed such that a cross-sectional area along a plane parallel to a second horizontal direction perpendicular to the first horizontal direction and a vertical direction is constant in the plurality of semiconductor layers included in the mold pattern.

13. The method as claimed in claim 10, wherein, in the forming of the mold layer, each of the plurality of sacrificial layers includes a compound semiconductor layer including Ge, and the closer the plurality of sacrificial layers are to the substrate, the greater a Ge content ratio in the plurality of sacrificial layers is.

14. A method of manufacturing an integrated circuit device, the method comprising:

forming a mold layer in which a plurality of Si layers having greater thickness farther away from a substrate and a plurality of SiGe layers having a constant thickness are alternately stacked one by one on the substrate;

forming a mold pattern including parts of the plurality of Si layers and parts of SiGe layers by anisotropically etching the mold layer and longitudinally extending along a first horizontal direction;

substituting the plurality of SiGe layers with a plurality of intermediate insulating layers in the mold pattern;

forming a plurality of indent regions each having a height in a vertical direction defined by the plurality of intermediate insulating layers by removing a part of each of the plurality of Si layers; and forming a plurality of capacitors in the plurality of indent regions, wherein the forming of the plurality of capacitors includes:

forming a plurality of first electrode layers conformally covering surfaces of the plurality of Si layers and surfaces of the plurality of intermediate insulating layers exposed in the plurality of indent regions;

forming a dielectric layer conformally covering the plurality of first electrode layers in the plurality of indent regions; and forming a second electrode layer filling the plurality of indent regions on the dielectric layer, wherein the plurality of capacitors is formed such that the farther the plurality of capacitors are away from the substrate, the greater thicknesses of the plurality of capacitors in the vertical direction are.

15. The method as claimed in claim 14, wherein, in the forming of the mold layer, the plurality of Si layers have different thicknesses within a range of about 5 nm to about 500 nm in the vertical direction.

16. The method as claimed in claim 14, wherein, in the forming of the mold layer, the plurality of SiGe layers has a constant thickness within a range of about 5 nm to about 500 nm.

17. The method as claimed in claim 14, wherein, in the forming of the mold layer, the plurality of SiGe layers includes different Ge content ratios selected from a range of about 5 atomic % to about 60 atomic %.

* * * * *